United States Patent
Hsu et al.

(10) Patent No.: US 12,040,266 B2
(45) Date of Patent: Jul. 16, 2024

(54) PACKAGE SUBSTRATE, PACKAGE USING THE SAME, AND METHOD OF MANUFACTURING THE SAME

(71) Applicant: Taiwan Semiconductor Manufacturing Company, Ltd., Hsinchu (TW)

(72) Inventors: Hungen Hsu, Hsinchu (TW); Wei-Tien Shen, Hsinchu (TW); Kuo-Ching Hsu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 338 days.

(21) Appl. No.: 17/460,315

(22) Filed: Aug. 30, 2021

(65) Prior Publication Data

US 2023/0062775 A1    Mar. 2, 2023

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4857* (2013.01); *H01L 21/486* (2013.01);
(Continued)

(58) Field of Classification Search
CPC .......... H01L 23/49838; H01L 21/4857; H01L 21/486; H01L 23/49816; H01L 23/49822; H01L 23/49833; H01L 23/5223; H01L 23/5226; H01L 23/5283; H01L 23/5385; H01L 23/5386; H01L 25/165; H01L 28/60; H01L 28/90; H01L 23/13; H01L 23/14; H01L 23/3121; H05K 3/4661; H05K 1/185; H05K 3/4697
See application file for complete search history.

(56) References Cited

U.S. PATENT DOCUMENTS

| | | | |
|---|---|---|---|
| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |

(Continued)

FOREIGN PATENT DOCUMENTS

CN    113035812 A  *  6/2021 ............. H01L 21/48

OTHER PUBLICATIONS

Machine Translation of CN113035812A.*
"Office Action of Taiwan Counterpart Application", dated Nov. 15, 2022, pp. 1-5.

*Primary Examiner* — Evan G Clinton
(74) *Attorney, Agent, or Firm* — JCIPRNET

(57) ABSTRACT

Embodiments provide a package substrate. The package substrate includes a substrate having a cavity hole therein, and a semiconductor device in the cavity hole. The semiconductor device has first terminal side and a second terminal side opposite to the first terminal side. The package substrate further includes a first redistribution structure on the first terminal side of the cavity substrate to electrically couple to a first pad and a second pad on the first terminal side of the semiconductor device; and a second redistribution structure on the second side of the cavity substrate to electrically couple to a third pad and fourth pad on the second terminal side of the semiconductor device.

20 Claims, 23 Drawing Sheets

(51) Int. Cl.
*H01L 23/522* (2006.01)
*H01L 23/528* (2006.01)
*H01L 23/538* (2006.01)
*H01L 25/16* (2023.01)
*H01L 49/02* (2006.01)

(52) U.S. Cl.
CPC .. *H01L 23/49816* (2013.01); *H01L 23/49822* (2013.01); *H01L 23/49833* (2013.01); *H01L 23/5223* (2013.01); *H01L 23/5226* (2013.01); *H01L 23/5283* (2013.01); *H01L 23/5385* (2013.01); *H01L 23/5386* (2013.01); *H01L 25/165* (2013.01); *H01L 28/60* (2013.01)

(56) References Cited

U.S. PATENT DOCUMENTS

| | | |
|---|---|---|
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2020/0153110 A1* | 5/2020 | Kim .................. H01Q 21/065 |
| 2021/0013140 A1 | 1/2021 | Chen et al. |
| 2022/0406523 A1* | 12/2022 | Kamgaing ............. H01G 4/40 |

* cited by examiner

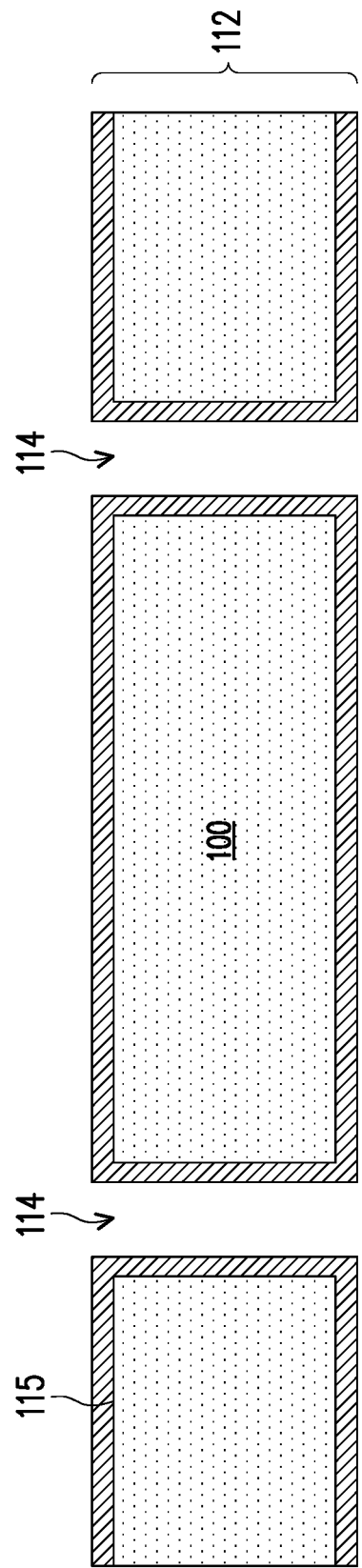

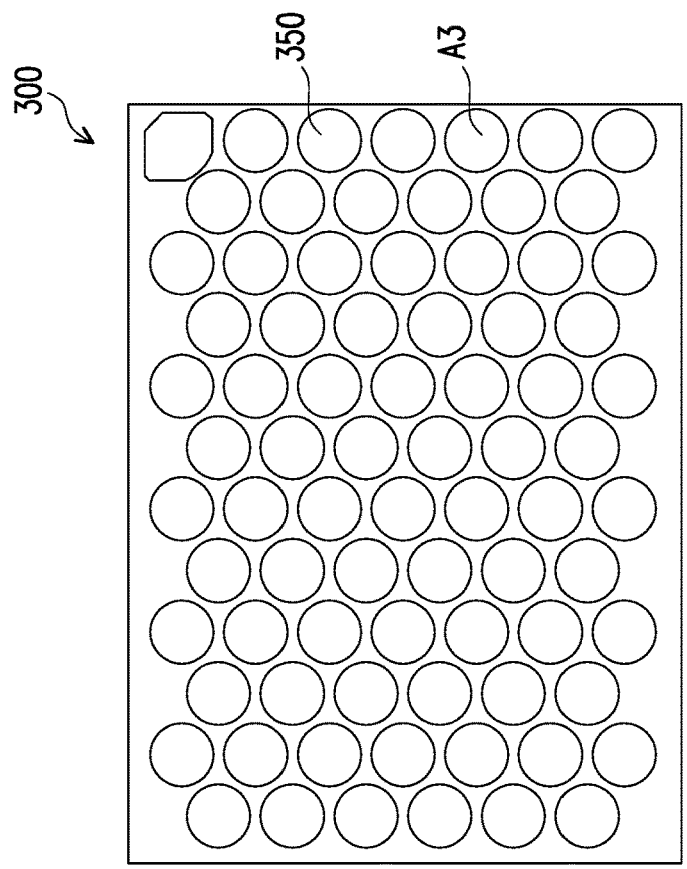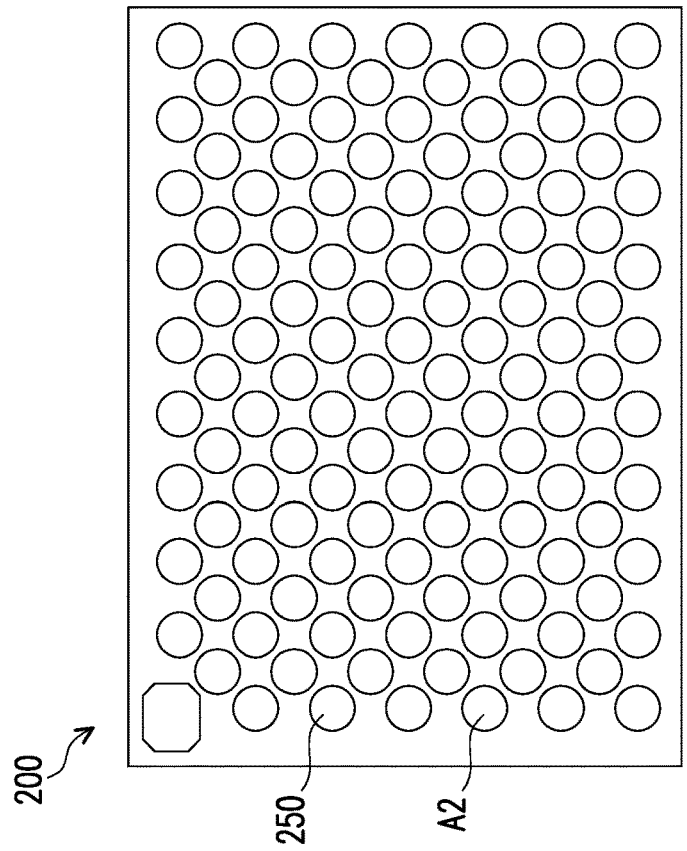
FIG. 4B

PACKAGE SUBSTRATE, PACKAGE USING THE SAME, AND METHOD OF MANUFACTURING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on. The formation of the redistribution circuit structure also plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B are various views of device components of a semiconductor device, in accordance with another embodiment.

DETAILED DESCRIPTION

Figure 1A:
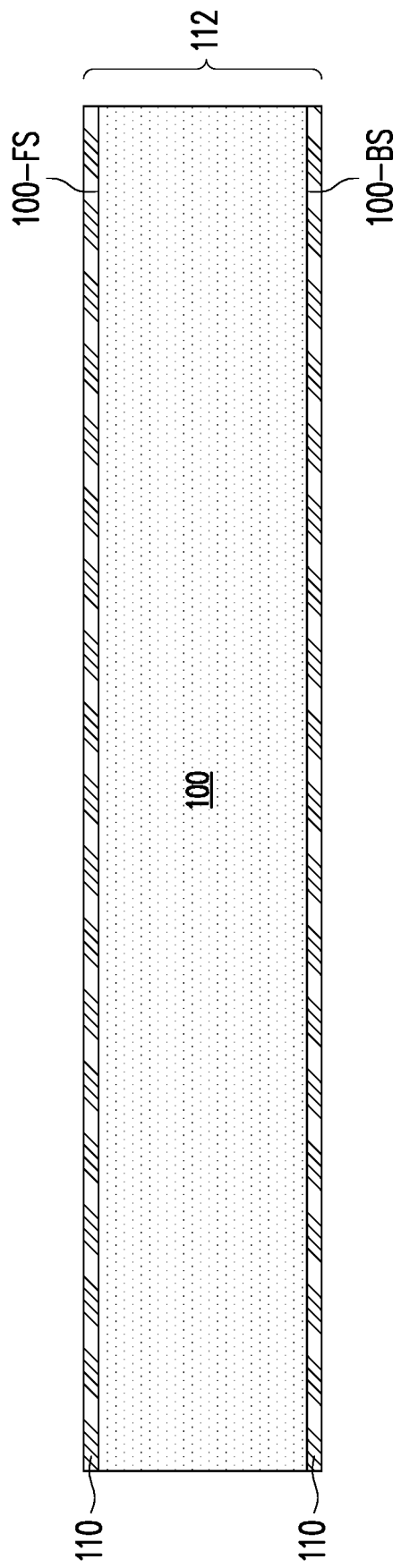
FIGS. 1A through 1O illustrate cross-sectional views of intermediate steps of forming a package using a package substrate having a semiconductor device embedded therein, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such thon the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed below provide a package using a package substrate having a semiconductor device embedded therein. The semiconductor device may have electrical terminals on its two sides to couple to a component attached on the package substrate through redistribution structures of the package substrate.

FIGS. 1A through 1O illustrate cross-sectional views of intermediate steps of forming a package using a package substrate having a semiconductor device embedded therein, in accordance with some embodiments.

Referring first to FIG. 1A there is shown a substrate (or referred to as a substrate core) 112 including an insulation layer 100 with conductive layers 110 on both sides of the insulation layer 100, in accordance with some embodiments. In some embodiments, substrate 112 is a double-sided copper clad laminate (CCL). The insulation layer 100 may be a pre-impregnated composite fiber (prepreg), ajinomoto build-up film (ABF), paper, glass fiber, non-woven glass fabric, other insulating materials or combinations thereof. The conductive layers 110 may be one or more layers of copper, nickel, aluminum, other conductive materials or combination thereof laminated or formed onto opposing sides 100-FS and 100-BS of the insulation layer 100.

Figure 1B:
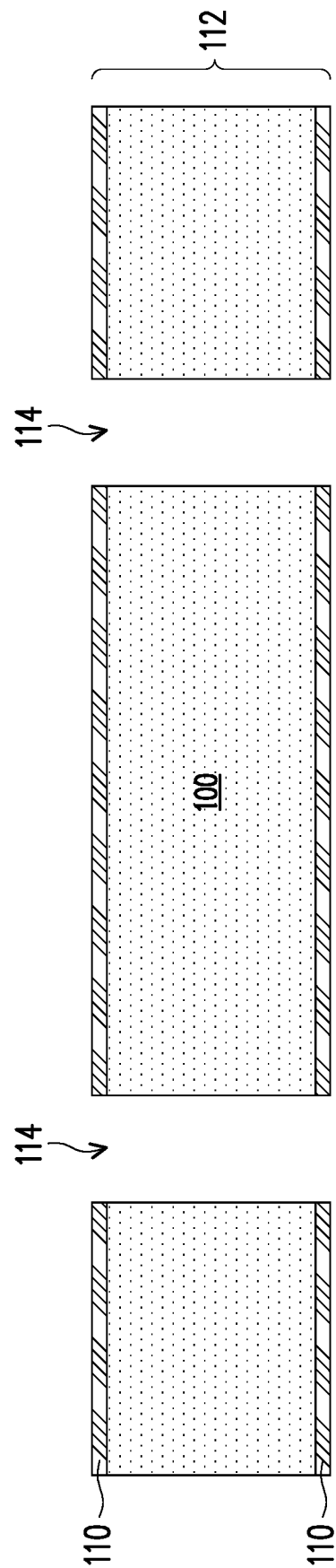

Referring to FIG. 1B, through holes 114 are formed in the substrate 112. In some embodiments, the through holes 114 are formed by laser drilling. Other processes, e.g., mechanical drilling, etching, or the like, may also be used. The top-view shape of through holes 114 may be circular (shown in FIGS. 2A and 2B), rectangular (not shown), or any other shape.

Referring to FIG. 1C, a conductive material is formed on the conductive layers 110 and sidewalls of the through holes 114 to form a conductive layer 115. The conductive material of the conductive layers 115 may be formed by, for example, plating, or the like. Prior to forming the conductive material on the conductive layers 110 and sidewalls of the through holes 114, a surface preparation process may be performed. The surface preparation process may include cleaning the exposed surfaces of the substrate 112 (e.g., surfaces of conductive layers 110 and surfaces of the insulation layer 100 in through holes 114) with one or more cleaning solutions (e.g., sulfuric acid, chromic acid, neutralizing alkaline solution, water rinse etc.) to remove or reduce soil, oils, and/or native oxide films. A desmear process may be performed to clean the area near the through holes 114, which may have been smeared with the material of the insulation layer 100 that was removed to form the through holes 114. The desmearing may be accomplished mechanically (e.g., blasting with a fine abrasive in a wet slurry), chemically (e.g., rinsing with a combination of organic solvents, permanganate etc.), or by a combination of mechanical and chemical desmearing. Following cleaning, treatment with a chemical conditioner, which facilitates adsorption of an activator used during subsequent electroless plating, may be used. In some embodiments, the conditioning step may be followed by micro-etching conductive layers 110 to micro-roughen the conductive surface for better bonding between the metal foil and the later deposited conductive material.

Figure 1D:
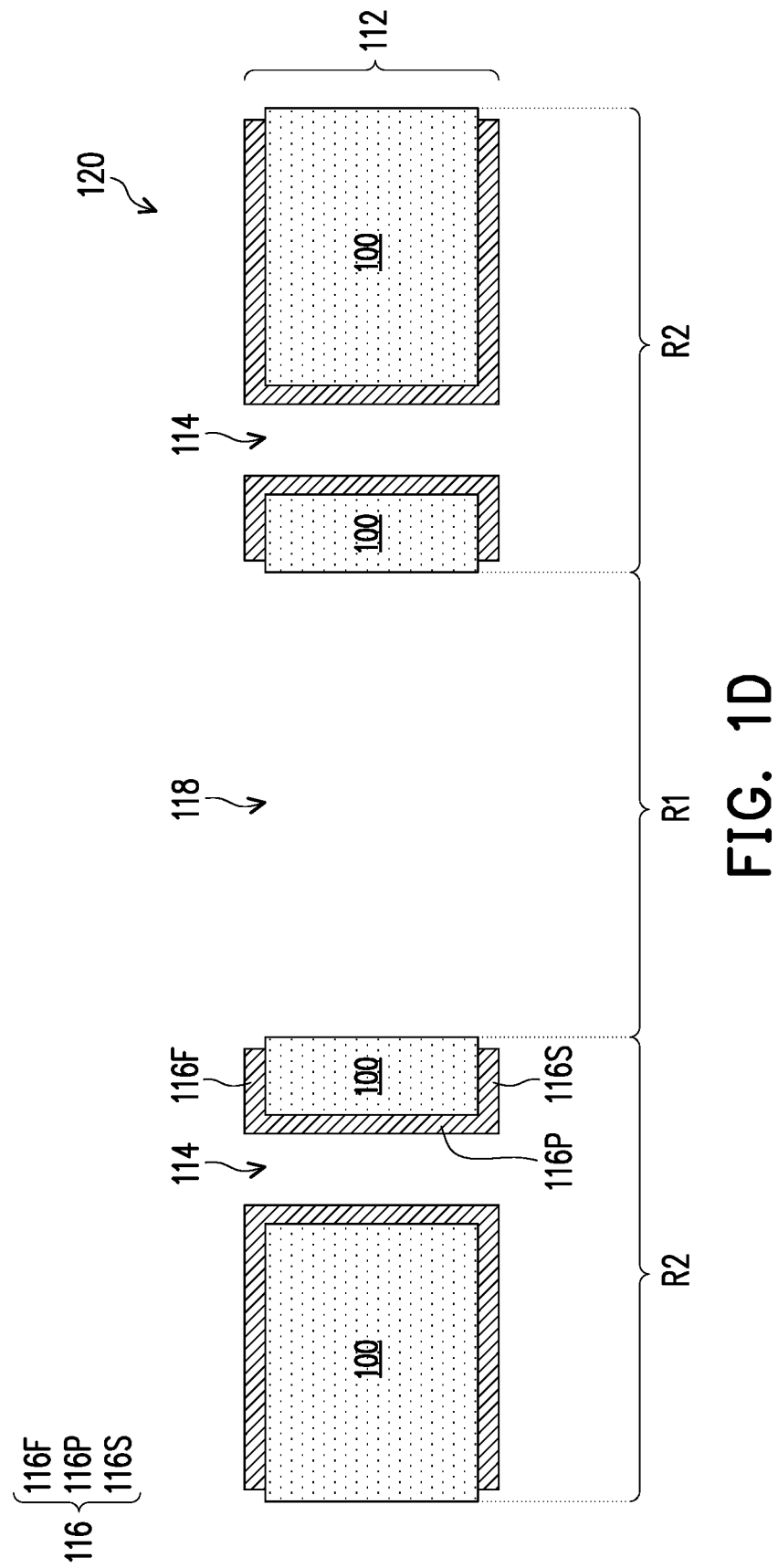

Referring to FIG. 1D, the conductive layers are patterned to form conductive traces 116. The conductive traces 116 may include conductive traces 116F, 116B, and 116P connected each other. The conductive trace 116F is formed on the sides 100-FS of the insulation layer 100. The conductive traces 116B is formed on the sides 100-BS of the insulation layer 100. The conductive traces 116P are formed on the sidewalls of the insulation layer 100 in the through holes 114, and connect to a portions of the conductive trace 116F and 116B.

Figure 2B:
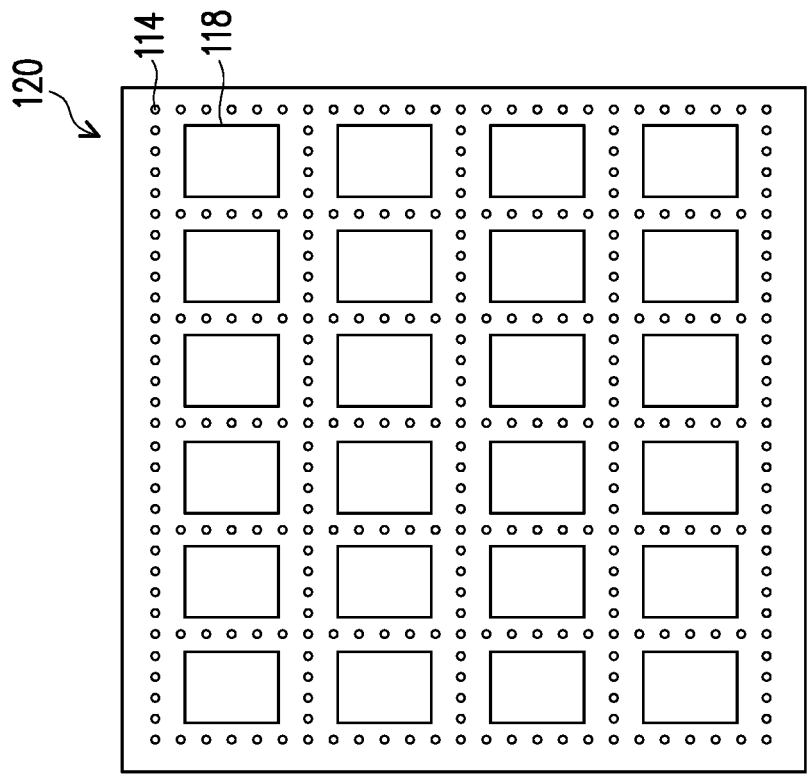
FIGS. 2A and 2B illustrate top views of cavity substrates.
Figure 2A:
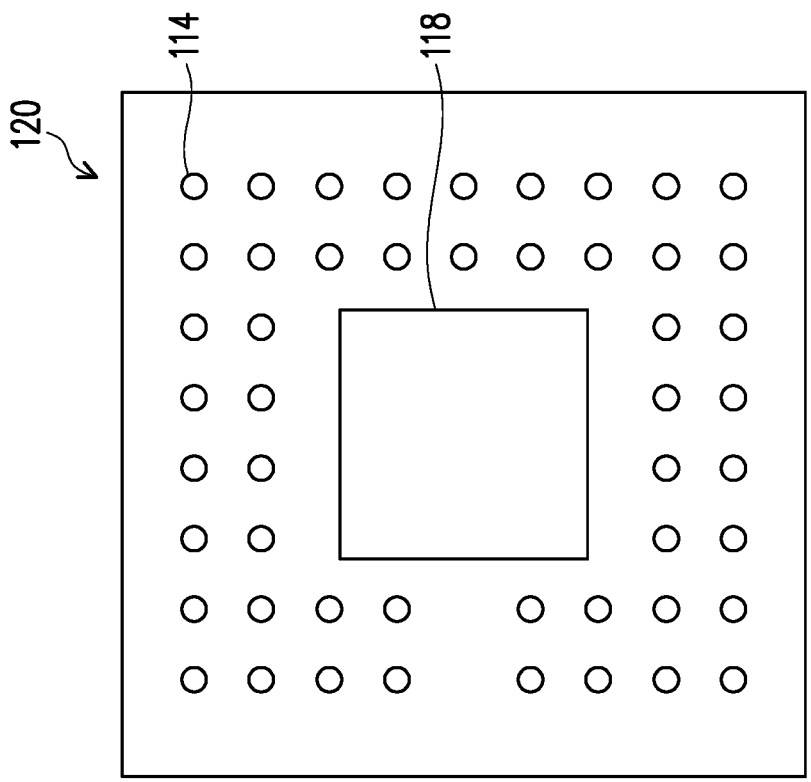

Referring to FIG. 1D, a cavity hole 118 is formed for form a cavity substrate 120 illustrated in FIG. 2A. The cavity hole 118 is formed in a region R1 of the substrate 112, and the through holes 114 are formed in a region R2 of the substrate 112. The region R1 is a region for forming a semiconductor device therein, and may be referred to as a semiconductor device region. The region R2 is a region outside the semiconductor device region. The cavity hole 118 may be formed by removing a portion of the conductive layers 115 on the opposing sides 100-FS and 100-BS of the insulation layer 100, and the insulation layer 100 in accordance with some embodiments. In some embodiments, the cavity hole 118 are formed by laser drilling. Other processes, e.g., mechanical drilling, etching, or the like, may also be used. The top-view shape of cavity hole 118 may be rectangular (shown in FIGS. 2A and 2B), circular (not shown), or any other shape.

Although FIGS. 1D and 2A illustrates one cavity hole 118 formed in the substrate 112, it should be appreciated that multiple cavity holes 118 may also be formed in the substrate 112, as shown in FIG. 2B. In FIG. 2B, the cavity holes 118 may have a same size or different sizes, and may be have a same shape or different shapes. The cavity holes 118 each are surrounded by the through hole 114 in accordance with some embodiments, but it is not limited thereto. The number of the cavity holes 118 in the cavity substrate 120 may be 2 to 50, or more.

Figure 1E:
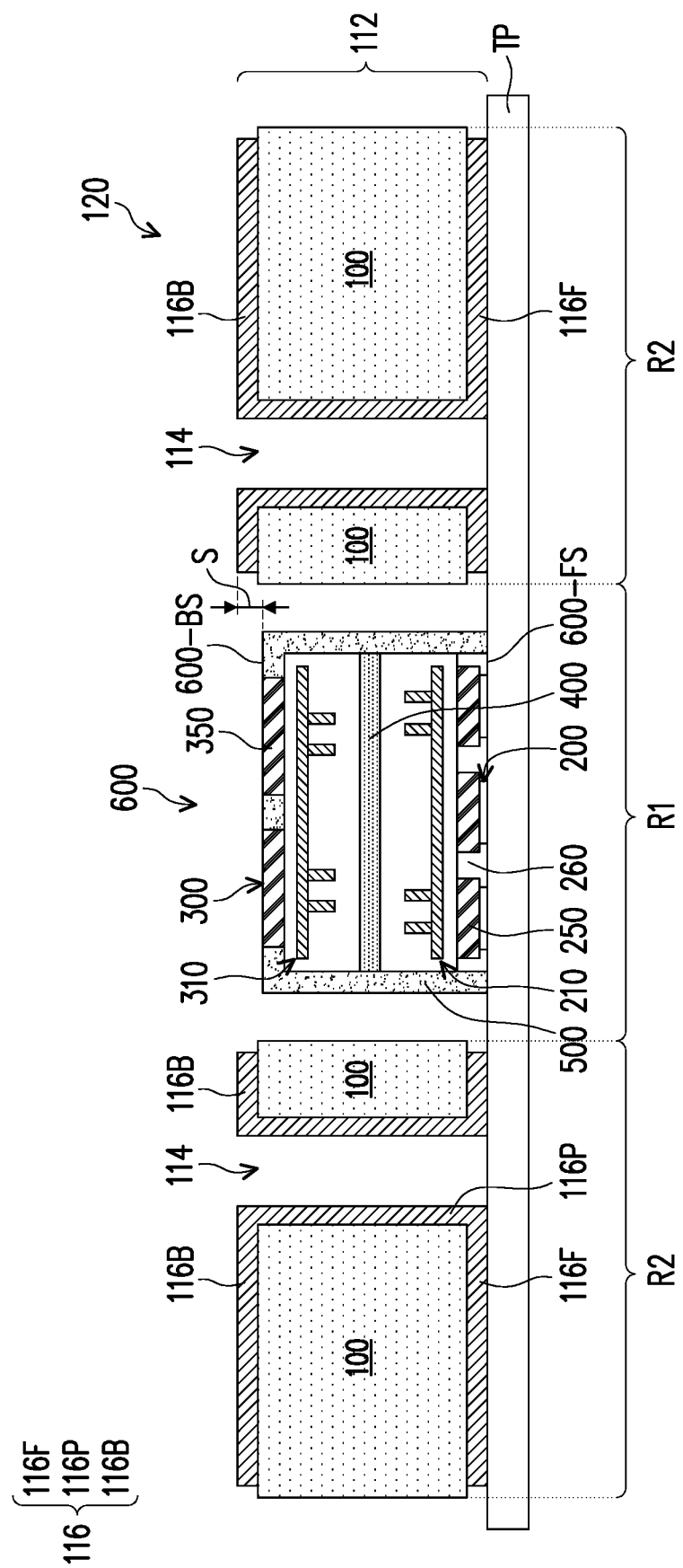

Referring to FIG. 1E, the cavity substrate 120 shown in FIG. 1D is attached to a tape TP. The tape TP may be attached to a frame (not shown). A semiconductor device 600 may be placed inside the cavity hole 118 (shown in FIG. 1D) of the cavity substrate 120 using a pick-and-place (PnP) tool. The semiconductor device 600 may be an integrated circuit die, a packaged die, an integrated passive device (IPD), an interposer, an antenna-in-package (AIP), a micro-electro-mechanical system (MEMS) package, or the like. In some embodiments, the semiconductor device 600 is adhered to the tape TP, as illustrated in FIG. 1E. Although FIG. 1E illustrates one semiconductor device 600 placed in each cavity hole 118, it should be appreciated that multiple dies may also be placed in the cavity hole 118 of the cavity substrate 120. For example, in some embodiments, the semiconductor device 600 may be a plurality of devices placed laterally adjacent one another and/or stacked upon each other, wherein the multiple devices may have the same or different sizes.

In the example illustrated in FIG. 1E, the semiconductor device 600 has double-sided electrical terminals. That is the semiconductor device 600 has two terminal sides 600-FS and 600-BS. The semiconductor device 600 may be a semiconductor device, e.g., an integrated circuit die such as, a passive die, a logic die (e.g., microprocessor, microcontroller, etc.), a memory die (e.g., dynamic random access memory (DRAM), static random access memory (SRAM), etc.), a system-on-a-chip (SoC) die (e.g., power management integrated circuit (PMIC), mixed signal integrated circuit, etc.), a radio frequency integrated circuit (RFIC) die, a digital signal processing (DSP) die, the like, or a combination thereof.

Before being placed onto the cavity substrate 120, the semiconductor device 600 may be processed according to applicable manufacturing processes to form the respective device structure. For example, the semiconductor device 600 may have been processed to form integrated circuits within the semiconductor device 600. As illustrated in FIG. 1E, in some embodiments, the semiconductor device 600 includes device components 200 and 300, and an adhesive 400 therebetween.

The device components 200 and 300 may be passive components such as capacitors, resistors, and inductors. The device components 200 and 300 may be passive components with same type or different types. In some embodiments, the device components 200 and 300 are capacitor components. In alternative, the device component 200 is a capacitor component, and the device component 300 is an inductor component or a resistor component.

Figure 3A:
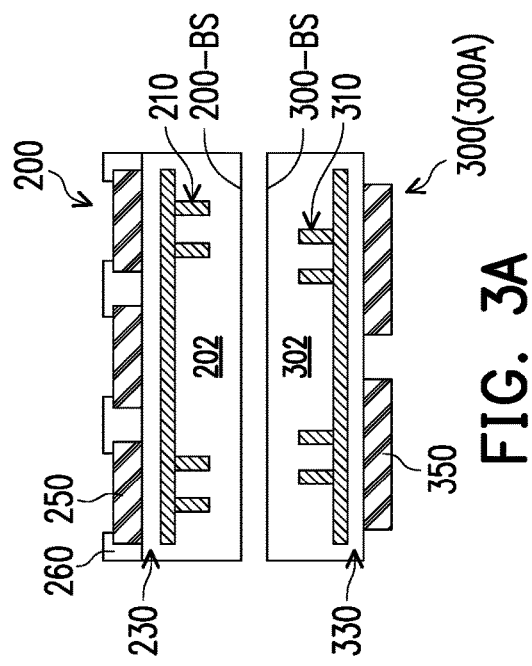
FIGS. 3A through 3D illustrate cross-sectional views of intermediate steps of forming a semiconductor device, in accordance with some embodiments.
Figure 3B:
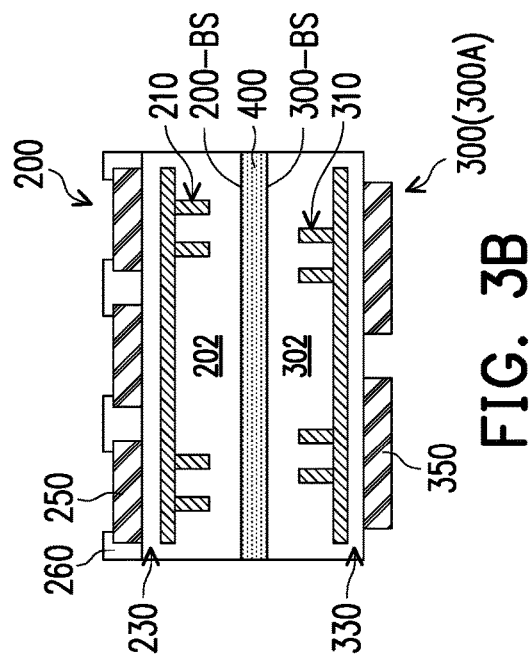
Figure 3C:
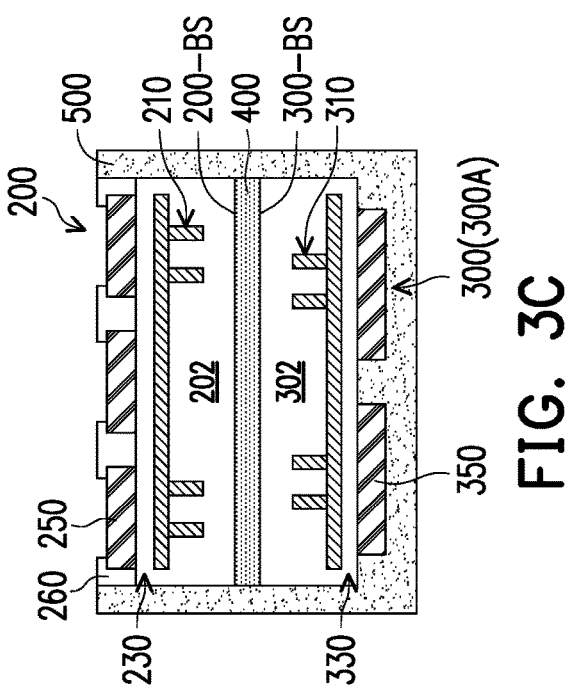
Figure 3D:
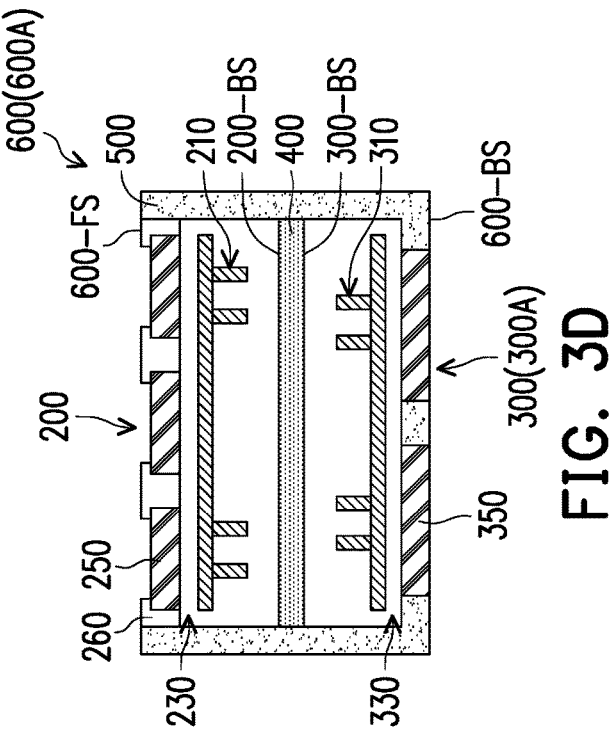
Figure 5A:
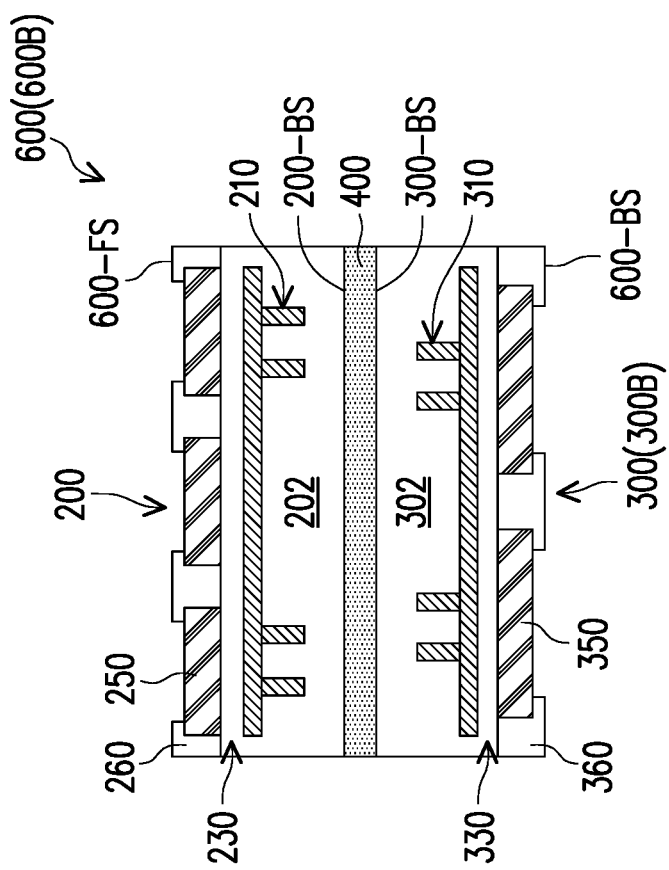
FIGS. 5A and 5B illustrate cross-sectional views of device components of a semiconductor device, in accordance with yet another embodiment.
Figure 6B:
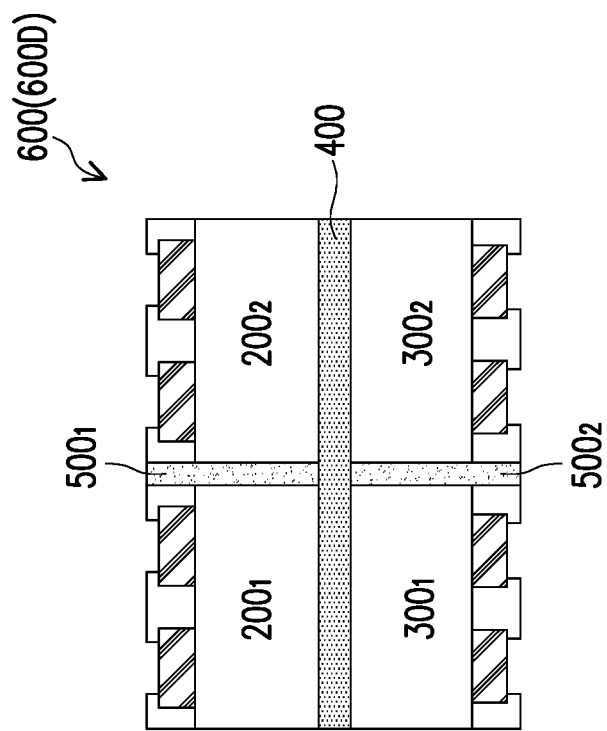
FIGS. 6A and 6B illustrate cross-sectional views of device components of a semiconductor device, in accordance with some other embodiments.
Figure 6A:
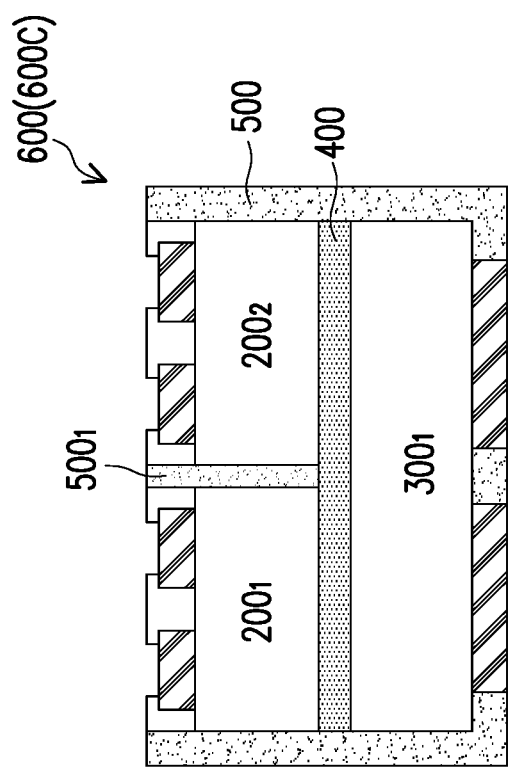

In some embodiments in which the device components 200 and 300 of the semiconductor device 600 are capacitor components, the semiconductor device 600 may be a semiconductor device 600A shown in FIG. 3D, a semiconductor device 600B shown in FIG. 5A, a semiconductor device 600C shown in FIG. 6A, or a semiconductor device 600D shown in FIG. 6B.

In FIG. 3D, the semiconductor device 600A includes device components 200 and 300A. The device component 200 is bonded to the device component 300A through an adhesive 400 in back-to-back manner. Further, sidewalls of the device components 200 and 300A are laterally encapsulated by an encapsulation layer 500.

The semiconductor device 600A shown in FIG. 3D may be processed according to a manufacturing processes shown in FIGS. 3A to 3D. The more detailed structure of the device components 200 and 300A are shown in FIG. 4A.

Figure 4A:
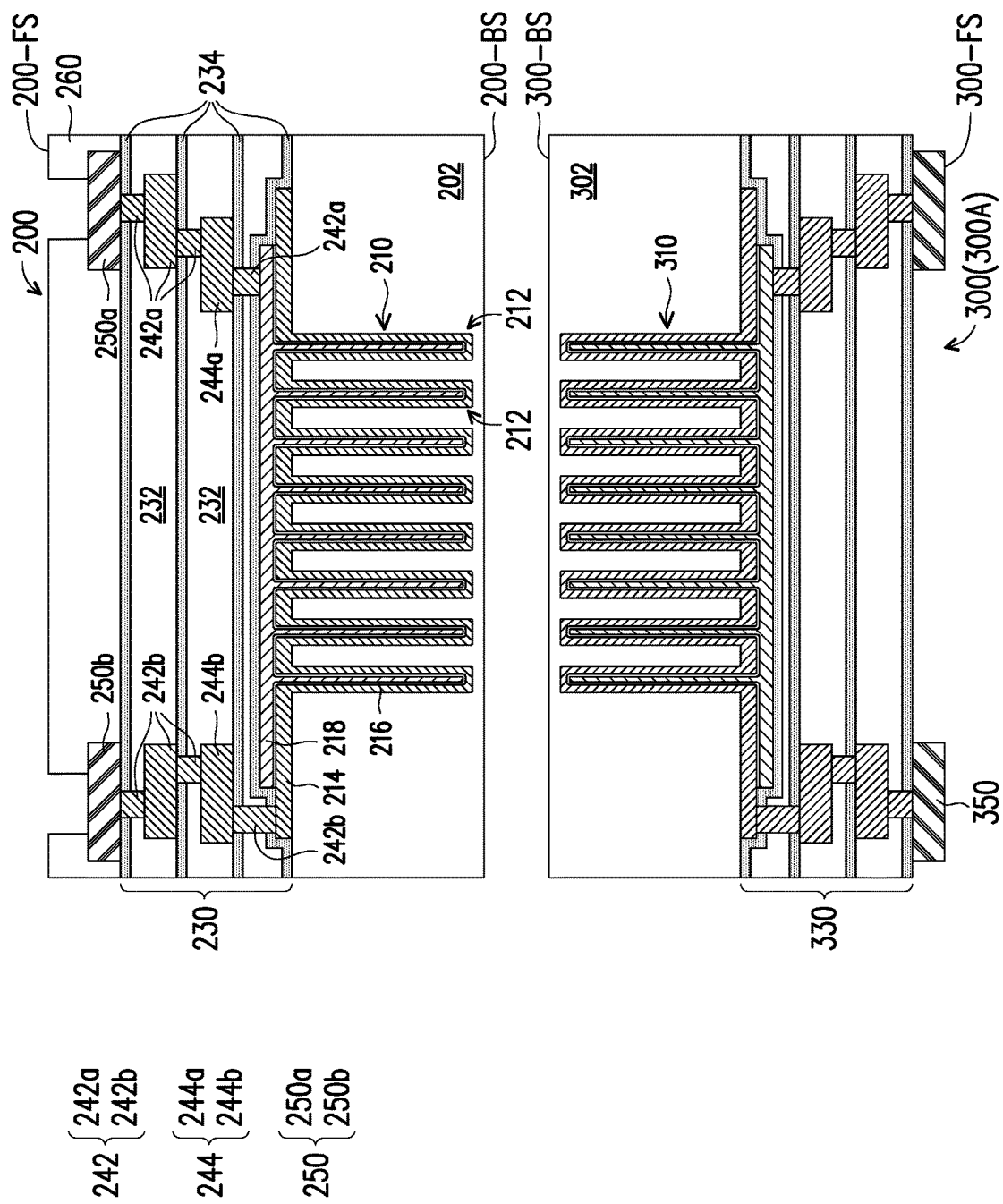

Referring to FIGS. 3A and 4A, the device component 200 may be a passive component including a semiconductor substrate 202, a capacitor 210, an interconnect structure 230, conductive pads 250, and a passivation layer 260. In some embodiments, the device component 200 may be referred to as a silicon cap. The semiconductor substrate 202 may be a bulk substrate or an active layer of a semiconductor-on-insulator (SOI) substrate and may include a group-IV semiconductor such as silicon and germanium, a compound semiconductor, and/or an alloy semiconductor; doped or undoped.

Referring to FIG. 4A, the semiconductor substrate 202 includes a number of trenches 212 to establish a capacitor 210 in an upper surface of the semiconductor substrate 202. The device component 200 may include one capacitor 210 or multiple capacitors 210. The capacitor 210 may be referred to as a metal-insulator-metal (MIM) capacitor, a MIM capacitor cell, or a trench capacitor. The capacitor 210 includes a bottom electrode layer 214, an insulating layer 216, and a top electrode layer 218 conformally arranged within the trenches 212 and on the semiconductor substrate 202.

The bottom electrode layer 214 and the top electrode layer 218 each may be or comprise, for example, doped polysilicon, titanium nitride (e.g., TiN), tantalum nitride (e.g., TaN), aluminum copper (e.g., AlCu), some other suitable metal(s) and/or material(s), or any combination of the foregoing. In some embodiments, the bottom electrode layers 214 and the top electrode layer 218 each comprises a tantalum nitride layer and an aluminum copper layer stacked upon each other. The insulating layer 216 may, for example, be or comprise silicon oxide, a high κ dielectric, some other suitable dielectric(s), or any combination of the foregoing. The high κ dielectric has a dielectric constant κ greater than that of silicon nitride and/or greater than about 10, 20, or 50. Other values are, however, amenable. The high κ dielectric may be or comprise, for example, hafnium oxide (e.g., $HfO_2$), zirconium oxide (e.g., $ZrO_2$), aluminum oxide (e.g., $Al_2O_3$), tantalum oxide (e.g., $Ta_2O_5$), titanium oxide (e.g., $TiO_2$), some other suitable high κ dielectric(s), or any combination of the foregoing.

The interconnect structure 230 may include, for example, metallization patterns 240 in one or more dielectric layers 232 formed on the semiconductor substrate 202 to interconnect the capacitor 210 formed in and/or semiconductor substrate 202 to form an integrated circuit. The interconnect structure 230 may further include etch stop layers 234 between the dielectric layers 232. The dielectric layer 232 and the etch stop layers 234 each may be or comprise, for example, silicon nitride, silicon oxide, or any combination of the foregoing.

The metallization patterns 240 include conductive vias 242 and conductive layers 244 to form conductive paths between the capacitor 210 and the conductive pads 250. The conductive vias 242 includes conductive vias 242a and 242b, and the conductive layers 244 includes conductive layers 244a and 244b. The conductive vias 242 and conductive layers 244 may be or comprise, for example, copper, aluminum copper, tungsten, some other suitable metal(s), or any combination of the foregoing.

The conductive pads 250 may be metal pads to which external connections are made. The conductive pads 250 may be or comprise, for example, copper, aluminum copper, tungsten, some other suitable metal(s), or any combination of the foregoing. The passivation layer 260 is formed on the dielectric layer 232 or the etch stop layer 234 of the interconnect structure 230 and on portions of the conductive pads 250. The passivation layer 260 may be one or more layers of conductive materials. The passivation layer 260 may be or comprise, for example, silicon oxide, silicon nitride, polyimide, some other suitable dielectric(s), or any combination of the foregoing.

In some embodiments, the conductive vias 242a, the conductive layers 244a and conductive pad 250a are coupled the top electrode layer 218, through the dielectric layers 232 and etch stop layers 234 to make electrical contact with the top electrode layer 218; and the conductive vias 242b, the conductive layers 244b and conductive pad 250b are coupled the top electrode layer 214, through the dielectric layers 232 and etch stop layers 234 to make electrical contact with the bottom electrode layer 214.

In FIGS. 3A and 4A, the device component 300A may be a passive component, and the structure of the device component 300A may be similar to or different from the device component 200. In some embodiments, the device component 300A includes a semiconductor substrate 302, a capacitor 310, an interconnect structure 330, and conductive pads 350. The semiconductor substrate 302, the capacitor 310, the interconnect structure 330, and the conductive pads 350 of the device component 300B may be similar to corresponding components of the device component 200. In some embodiments, the device component 300A is free of passivation layer, and thus top surface and sidewall surfaces of the conductive pads 350 are exposed. In alternative some embodiments, a device component 300B includes a passivation layer 360 shown in FIGS. 5A and 5B, and it will be described in detail later. In some embodiments, the top area A3 of the conductive pads 350 each is greater than the top area A2 of the conductive pad 250 as shown in FIG. 4B, but it is not limited thereto.

Referring to FIG. 3B, a backside 200-BS of the device component 200 is bonded to a backside 300-BS of the device component 300A through the adhesive 400. The adhesive 400 may be any suitable adhesive, epoxy, die attach film (DAF), or the like. The adhesive 400 may be applied to the backside 200-BS of the device component 200, such as to a backside of the respective semiconductor wafer prior to singulation. The device component 200, and the device component 300 may be respectively singulated, such as by sawing or dicing, and adhered each other by the adhesive 400 using, for example, PnP tool.

Referring to FIG. 3C, the encapsulation layer 500 is formed to encapsulate the device components 200 and 300A. The encapsulation layer 500 laterally encapsulates sidewalls of the device components 200 and 300A, and the encapsulation layer 500 may extend laterally to sidewalls and top surfaces of the conductive pads 350 of the device component 300A. The material of the encapsulation layer 500 is different form the material of the insulation layer 100. In some embodiments, the material of the encapsulation layer 500 includes a molding compound, a molding underfill, a resin such as epoxy, a combination thereof, or the like. In alternative some embodiments, the material of encapsulation layer 500 may be a polymer such as polybenzoxazole (PBO), benzocyclobutene (BCB) based polymer, polyimide, or the like; a nitride such as silicon nitride or the like; an oxide such as silicon oxide, PSG, BSG, BPSG, or the like; the like, or combinations thereof, and may be formed, for example, by spin coating, lamination, CVD, or the like.

Referring to FIG. 3D, a portion of the encapsulation layer 500 is removed, and the top surfaces of the conductive pads 350 of the device component 300 are exposed. Removal of the portion of the encapsulation layer 500 may be performed by a planarization process, such as chemical mechanical polish (CMP) or grinding. Thereafter, the current structure may be singulated by, for example, a sawing process, a laser ablation process, an etching process or the like. As a result, a singulated semiconductor device 600A is formed.

The side of the semiconductor device 600A where the conductive pads 250, the passivation layer 260, and the encapsulation layer 500 are located may be referred to as the terminal side 600-FS of the semiconductor device 600. The side opposite the terminal side 600-FS where the conductive pads 350 and the encapsulation layer 500 are located may be referred to as the terminal side 600-BS of the semiconductor device 600A. On the terminal side 600-FS of the semiconductor device 600A, the top surface of the encapsulation layer 500 is coplanar with the top surface of the passivation layer 260, and the top surface of the conductive pads 250 is lower than the top surface of the passivation layer 260 and the top surface of the encapsulation layer 500. On the terminal side 600-BS of the semiconductor device 600A, the top surface of the encapsulation layer 500 is coplanar with the top surface of the conductive pads 350.

In FIG. 1E, after the semiconductor device 600 is placed inside and embedded in the cavity hole 118 (shown in FIG.

1D) of the cavity substrate 120, the top surfaces of the passivation layer 260 and the encapsulation layer 500 are coplanar with the top surface of the conductive trace 116F. The top surface of the conductive pads 350 and another top surface of the encapsulation layer 500 on the terminal side 600-BS is lower than the top surface of the conductive trace 116B, and thus form a step S therebetween in accordance with some embodiments, but it is not limited thereto. In alternative embodiments, the top surface of the conductive pads 350 and another top surface of the encapsulation layer 500 on the terminal side 600-BS is coplanar with the top surface of the conductive trace 116B.

FIGS. 1F through 1K illustrate the formation of a redistribution structure 180F over the side 100-FS of the insulation layer 100 and the terminal side 600-FS of the semiconductor device 600, and the formation of a redistribution structure 180B over the side 100-BS of the insulation layer 100 and the terminal side 600-BS of the semiconductor device 600 after removal of the tape TP shown in FIG. 1E. The redistribution structure 180F and 180B each includes a vertical stack of alternating layers of dielectric and conductive traces. Each layer of conductive traces is separated from vertically adjacent layers of conductive traces by a dielectric layer. The conductive traces extend through underlying dielectric layers to form conductive vias used to interconnect vertically adjacent conductive traces.

Figure 1F:
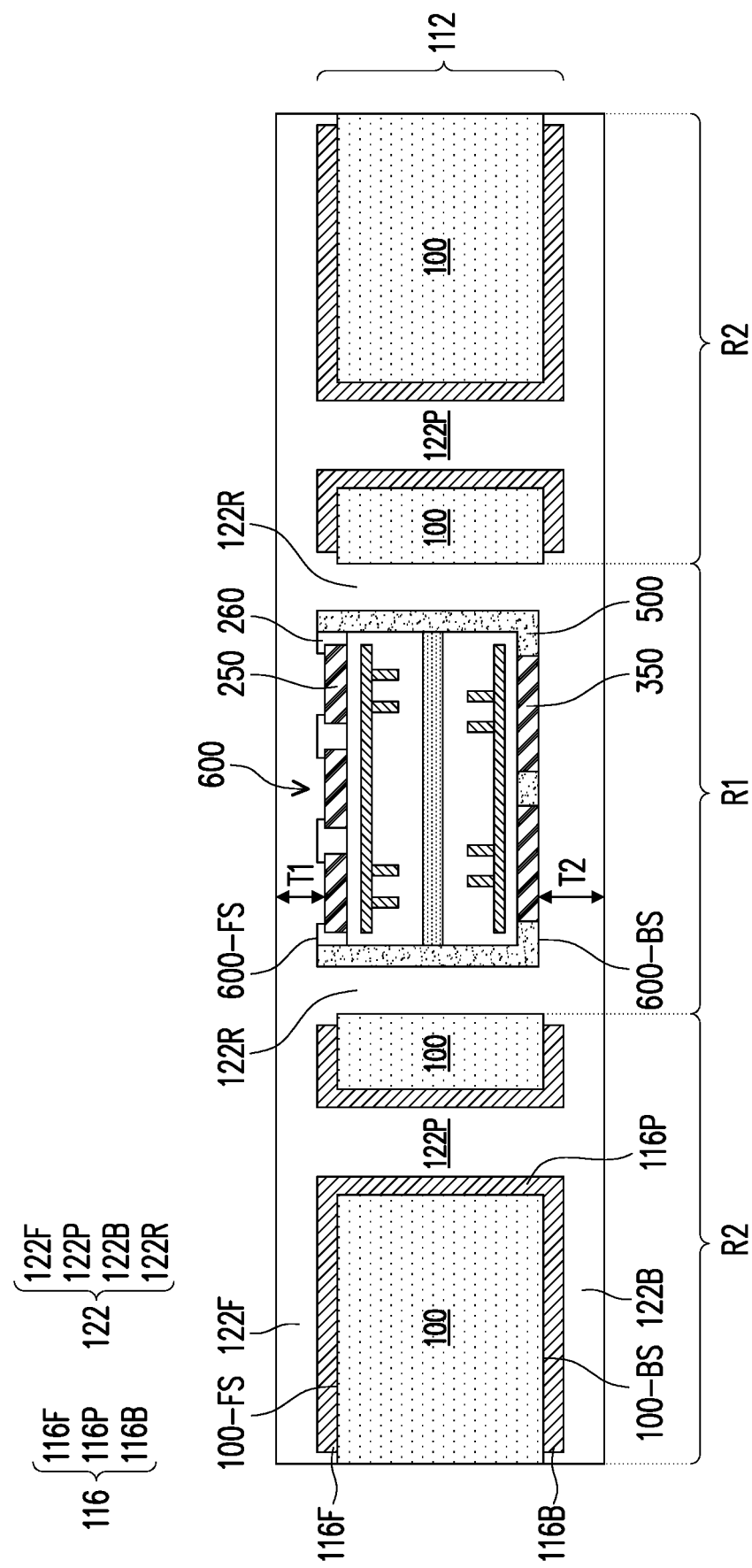

In FIG. 1F, in some embodiments, a dielectric layer 122 is formed over the insulation layer 100 and filled in the through holes 114 (shown in FIG. 1E) of the insulation layer 100 and the space between the semiconductor device 600 and the adjacent insulation layer 100.

In some embodiments, the dielectric layer 122 may also be formed of materials which are not photo-sensitive such as ajinomoto build-up film (ABF), silicon nitride, silicon oxide, phosphosilicate glass (PSG), borophosphosilicate glass (BPSG), or the like. In alternative embodiments, the dielectric layer 122 is formed of a polymer, which may be a photo-sensitive material such as PBO, polyimide, BCB, or the like, that may be patterned using a lithography mask. In alternative embodiments, the dielectric layer 122 is formed of or the like. The dielectric layer 122 may be formed by spin coating, lamination, chemical vapor deposition (CVD), the like, or a combination thereof.

In detail, the dielectric layer 122 may include dielectric layers 122F and 122B, and dielectric plugs 122P. The dielectric layer 122 further includes a dielectric part 122R in accordance with some embodiments.

The dielectric layers 122F is located over the insulation layer 100, the conductive traces 116F, and the conductive pads 250, the passivation layer 260 and the encapsulation layer 500 on the terminal side 600-FS of the semiconductor device 600. The dielectric layers 122B is formed over the insulation layer 100, the conductive traces 116B, and over the conductive pads 350 and the encapsulation layer 500 on the terminal side 600-FS of the semiconductor device 600. In some embodiments, the thickness T1 of the dielectric layer 122F on the conductive pads 250 and the thickness T2 of the dielectric layer 122B on the conductive pads 350 may be non-uniform. For example, the thickness T1 is less than the thickness T2. In alternative some embodiments, the thickness T1 is equal to the thickness T2.

The dielectric plugs 122P are embedded in the insulation layer 100, and connected to the dielectric layer 122F and the dielectric layer 122B. The dielectric part 122R is buried between the semiconductor device 600 and the adjacent insulation layer 100, and connected to the dielectric layer 122F and the dielectric layer 122B. In some embodiments, the dielectric portion 122R may have a ring shape or a semi-ring shape, but it is not limited thereto.

Figure 1G:
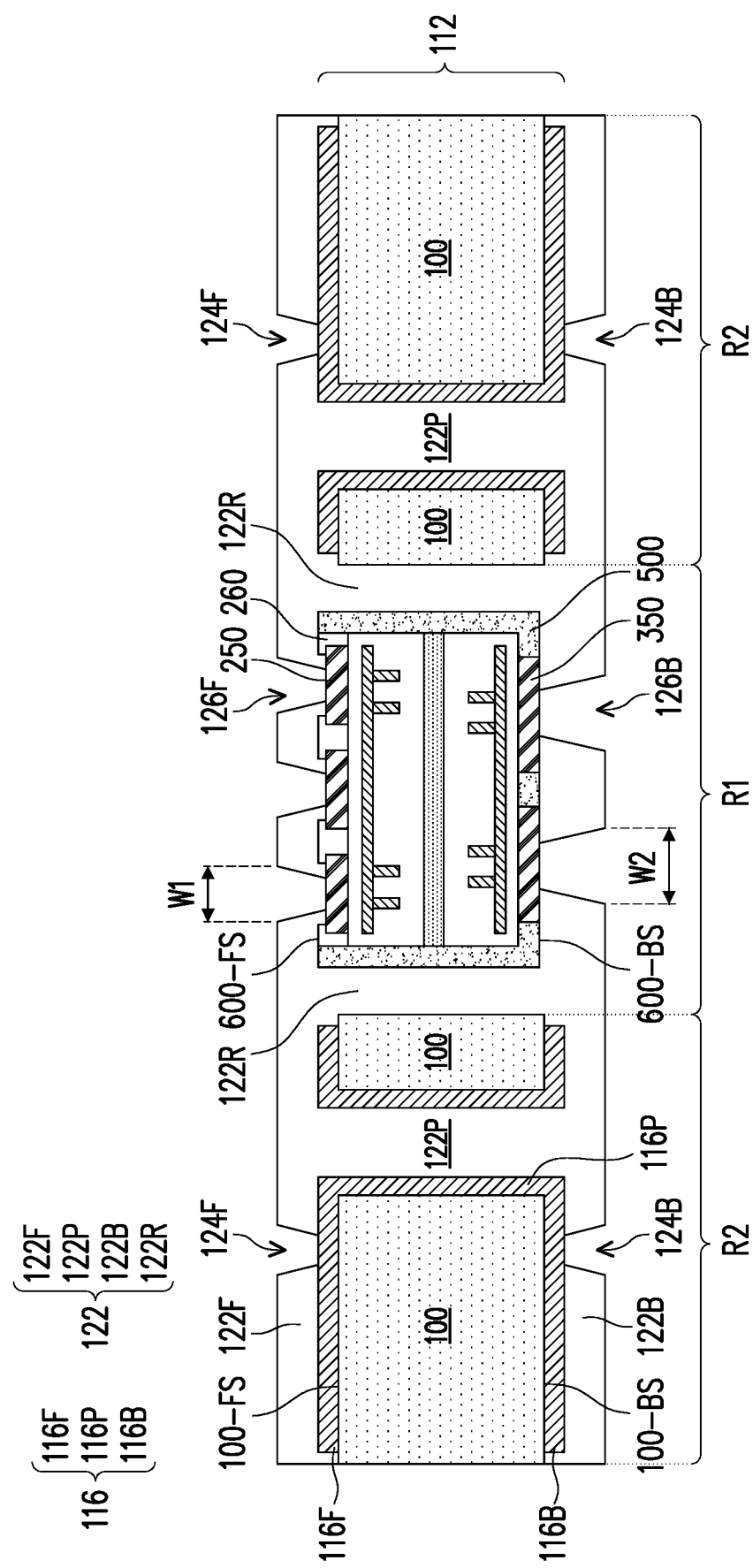

In FIG. 1G, via holes 124F and 126F are formed in the dielectric layers 122F to expose portions of the conductive trace 116F in the region R2 and portions of the conductive pads 250 in the region R1, respectively. Via holes 124B and 126B are formed in the dielectric layers 122B to expose portions of the conductive trace 116B in the region R2 and portions of the conductive pads 350 in the region R1, respectively. In some embodiments in which the thickness T1 is less than the thickness T2 (shown in 1F), the width W1 of the via hole 126F and the width W2 of the via hole 126B may be different. For example, the width W1 is less than the width W2. In alternative some embodiments in which the thickness T1 is equal to the thickness T2 (shown in 1F), the width W1 is equal to the width W2.

In some embodiments, the via holes 124F, 126F, 124B and 126B are formed by laser drilling when the dielectric layer 122 is formed of a material which is not photo-sensitive such as ajinomoto build-up film (ABF). In alternative embodiments, the via holes 124F, 126F, 124B and 126B are formed by a patterning process by a suitable etching process (e.g., anisotropic reactive ion etching) through a patterned photo-resist mask. In other some embodiments, the via holes 124F, 126F, 124B and 126B may be formed by exposing the dielectric layer 122 to light when the dielectric layer 122 is a photo-sensitive material.

Figure 1H:
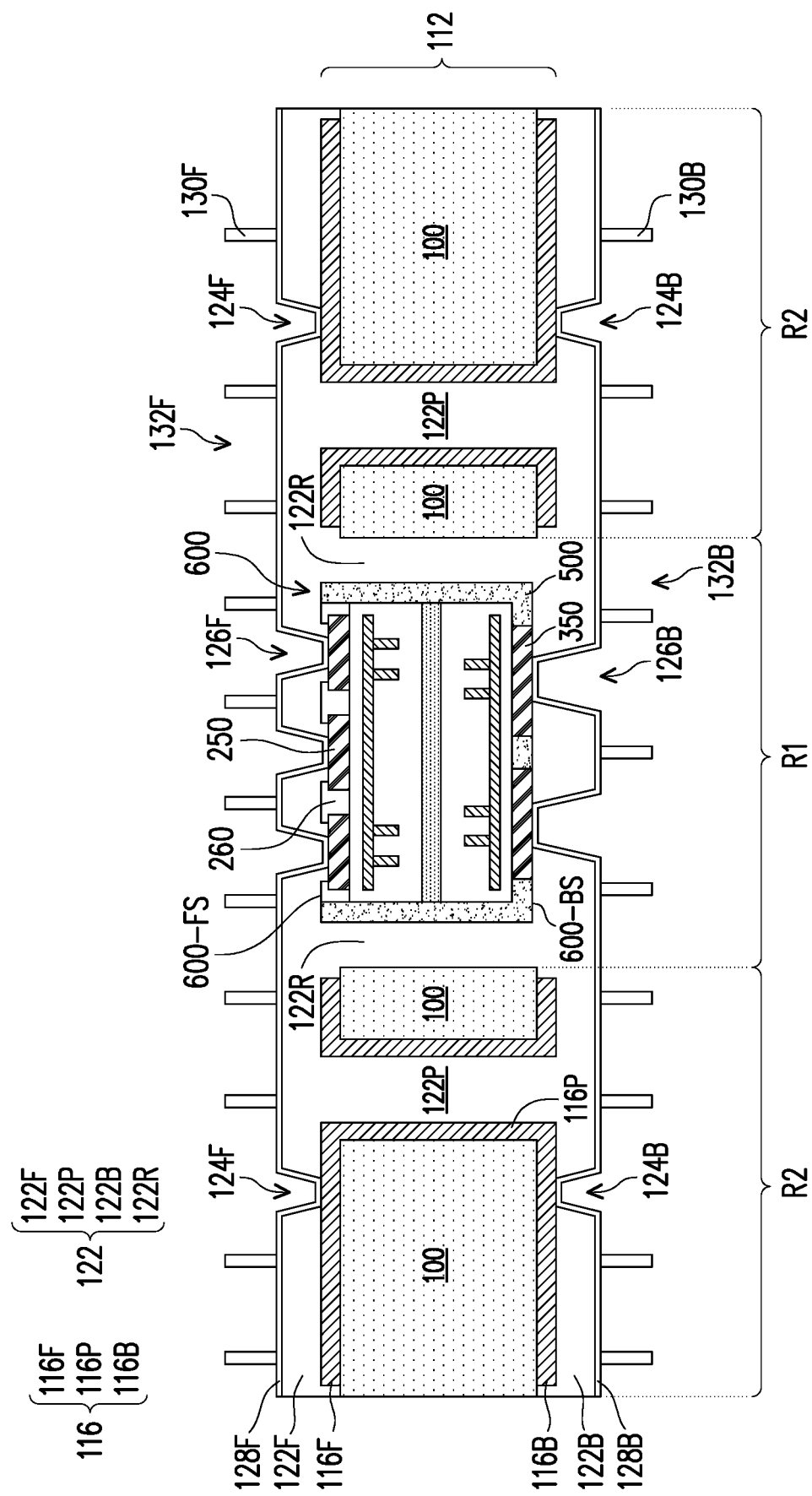
Figure 1I:
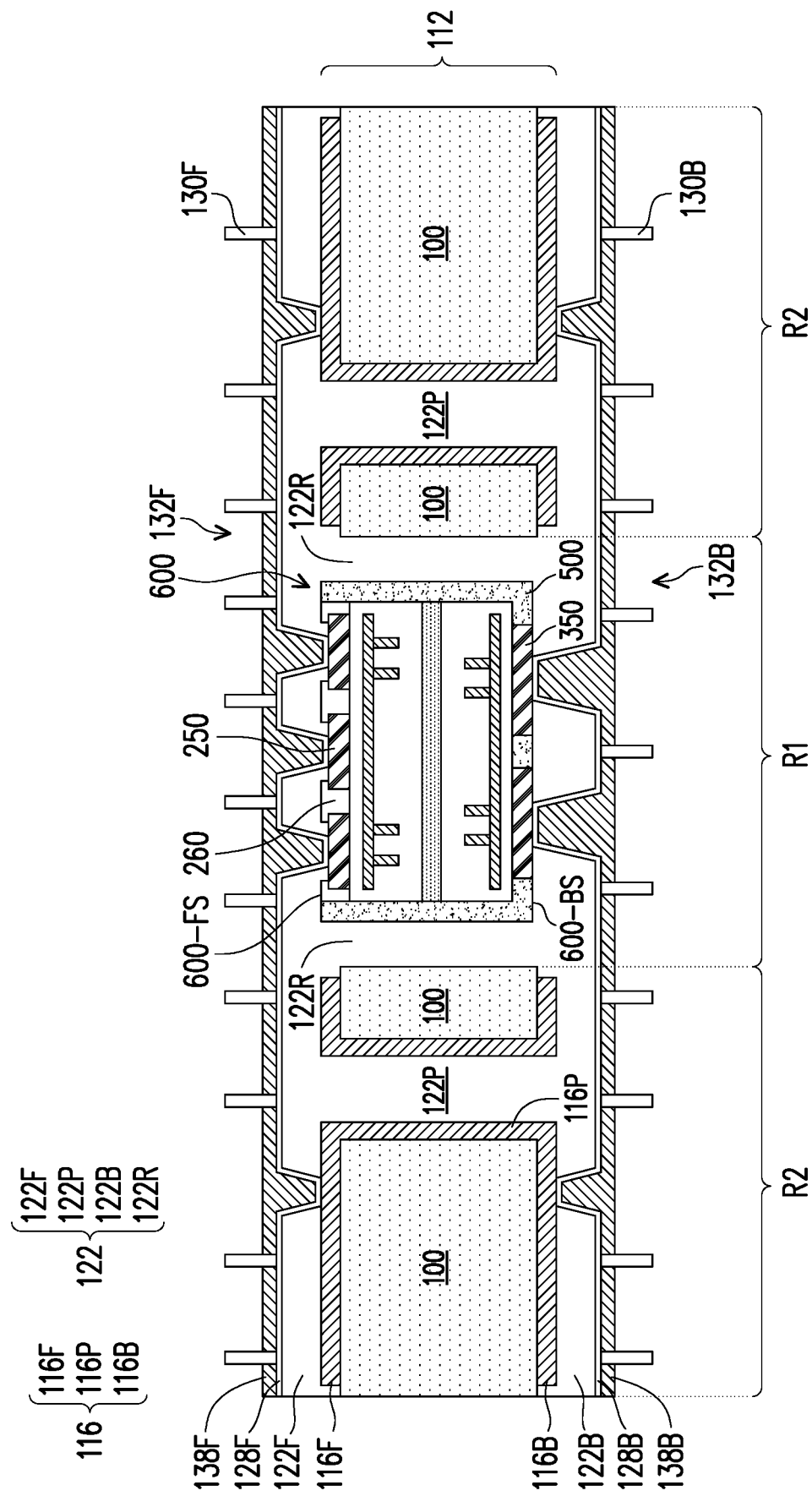
Figure 1J:
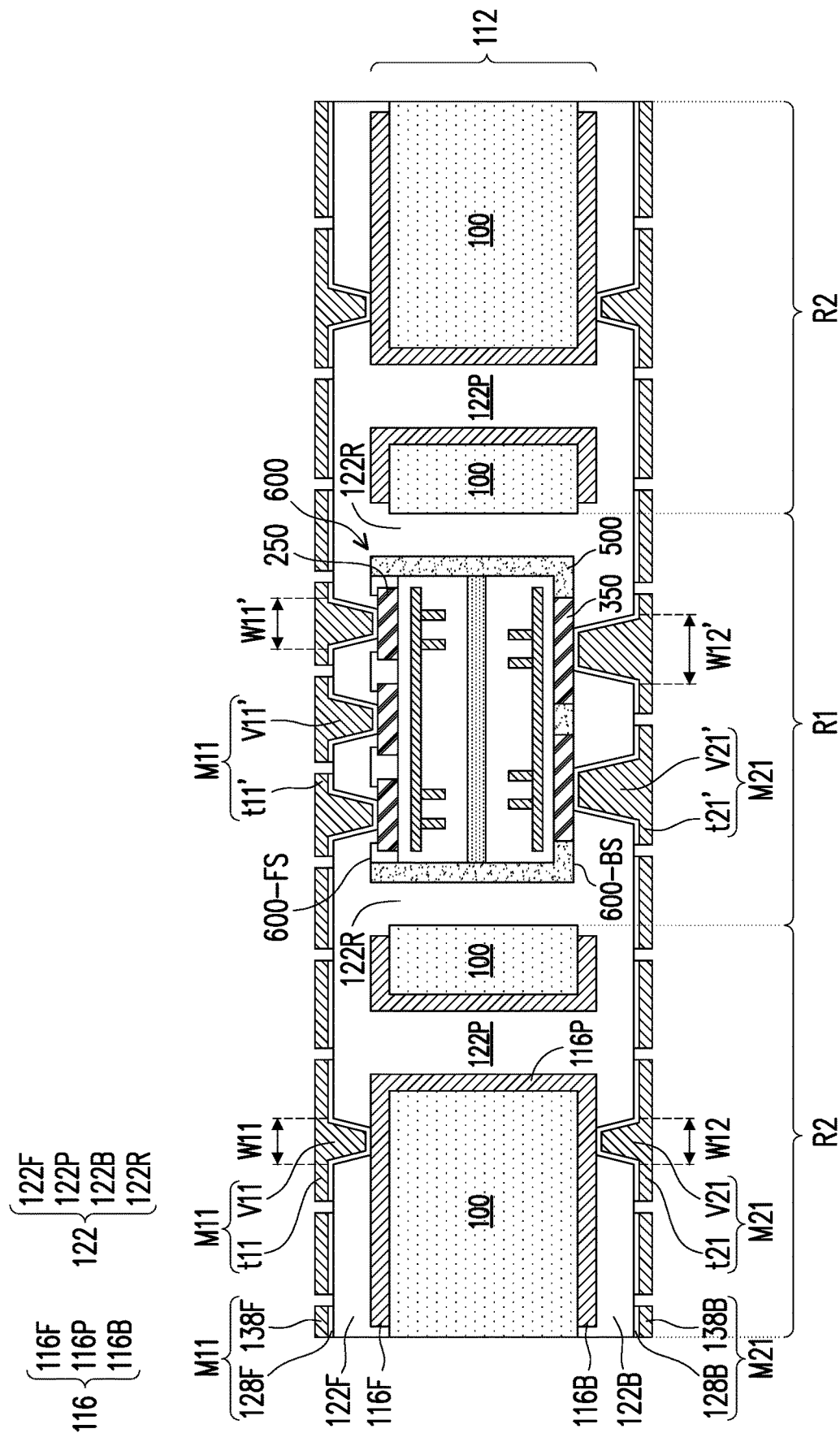

FIGS. 1H through 1J show a metallization pattern M11 formed on and extending through the patterned dielectric layer 122F, and a metallization pattern M21 formed on and extending through the patterned dielectric layer 122B. In some embodiments the metallization patterns M11 and M21 formed by first forming a metallic seed layer 128F on the dielectric layer 122F, and a metallic seed layer 128B on the dielectric layer 122B. The metallic seed layers 128F and 128B may be referred to as seed layers 128F and 128B.

Referring to FIG. 1H, in detail, the seed layer 128F is formed over the dielectric layer 122F, the sidewalls in the via holes 124F and 126F through the dielectric layer 122F, and over exposed portions of the conductive trace 116F on the bottom of the via hole 124F and the conductive pads 250 on the bottom of the via hole 126F. The seed layer 128B is formed over the dielectric layer 122B, the sidewalls in the via holes 124B and 126B through the dielectric layer 122B, and over exposed portions of the conductive trace 116B on the bottom of the via hole 124B and the conductive pads 350 on the bottom of the via hole 126B. The seed layers 128F and 128B each may include one or more layers of conductive materials, such as a copper layer or a composite layer of a titanium layer and a copper layer over the titanium layer. A layer of some other conductive material or a composite layer of several other conductive materials, or the like may also be used to form a seed layer. Any suitable deposition process (e.g., physical vapor deposition (PVD), CVD, or the like) may be used to form the seed layer.

In FIG. 1H, patterned mask layers 130F and 130B, such as patterned photoresist masking layers, are then respectively formed over the seed layers 128F and 128B to expose portions of the seed layer 128F and 128B through openings 132F and 132B in the patterned mask layers 130F and 130B.

Referring to 1I, a conductive layer 138F may be formed on the exposed portions of the seed layers 128F in the openings 132F of the patterned mask layers 130F. A conductive layer 138B may be formed on the exposed portions of the seed layers 128B in the openings 132B of the patterned mask layers 130B. The material used to form the conductive layers 138F and 138B each may include a metal such as copper, titanium, tungsten, aluminum, or the like, and may be deposited using a suitable deposition process, such as electroplating or electroless plating, or the like.

In FIG. 1J, after the deposition process to form the conductive layers 138F and 138B is completed, the patterned mask layers 130F and 130B (shown in FIG. 1I) are stripped using an acceptable process such as ashing, or exposing to oxygen plasma, or the like. Stripping the photoresist pattern exposes portions of the seed layer over which the material deposited using the photoresist mask was not formed. These exposed portions of the seed layer 128F and 128B are removed using any acceptable chemical etching process (e.g., wet chemical etching or plasma etching, or the like). The remaining portions of the seed layer 128F and the conductive layer 138F are included in the metallization pattern M11. The remaining portions of the seed layer 128B and the conductive layer 138B are included in the metallization pattern M21.

The metallization pattern M11 includes conductive traces t11 and t11' formed along the top surface of the dielectric layer 122F and conductive vias V11 and V11' through the dielectric layer 122F. The conductive vias V11 are formed in the region R2 and connect the conductive traces t11 of metallization M1l to the conductive trace 116F. The conductive vias V11' are formed in the region R1 and connect the conductive traces t11' of the metallization M11 to electrically and physically the conductive pads 250 of the semiconductor device 600.

The metallization pattern M21 includes conductive traces t21 and t21' formed along the top surface of the dielectric layer 122B and conductive vias V21 and V21' through the dielectric layer 122B. The conductive vias V21 are formed in region R2 and connect the conductive traces t21 of the metallization M21 to the conductive trace 116B directly below the dielectric 122B. The conductive vias V21' are formed in the region R1 and connect the conductive traces t21' of the metallization M21 to the conductive pads 350 of the semiconductor device 600.

In some embodiments, the width W11' of the conductive via V11' may be different from the width W21' of the conductive via V21'. For example, the width W11' is less than the widths W21'. In alternative some embodiments, the width W11' of the conductive via V11' in the region R1 may be different from the width W11 of the conductive via V11 in the region R2. The width W21' of the conductive via V21' in the region R1 may be different from the width W21 of the conductive via V21 in the region R2. For example, the width W11' is greater than the width W11, and the width W21' is greater than the width W21.

The method of forming the patterned dielectric layers 122F and 122B (shown in FIG. 1G) and conductive traces t11, t11', t21, and t21' and conductive vias V11, V11', V21 and V21' of metallization patterns M11 and M21 (shown in FIGS. 1H through 1I) is described as an example. It should be appreciated thon the processes for forming the dielectric layers 122F and 122B and metallization patterns M11 and M21 may be varied based on the specifications of the design, e.g., the desired minimum dimensions of the patterns. For example, in some embodiments a damascene process (single or dual damascene process) may be utilized. The redistribution structures 180F and 180B each may be built up by vertically stacking more of dielectric and metallization patterns.

Figure 1K:
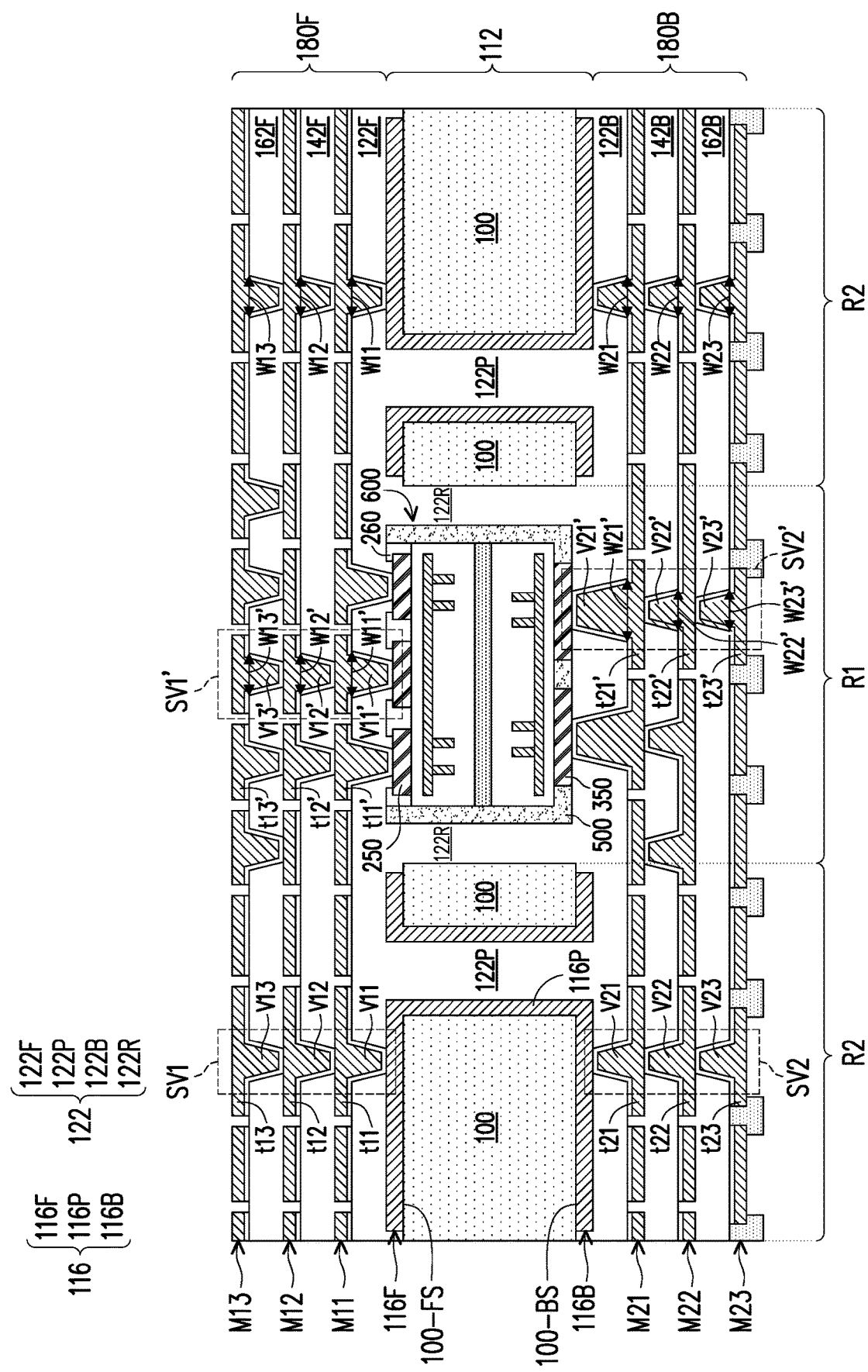

FIG. 1K illustrates a patterned dielectric layer 142F formed over the top surface of the dielectric layer 122F and the metallization pattern M11, and a patterned dielectric layer 142B formed over the top surface of the dielectric layer 122B and the metallization pattern M21.

Also shown in FIG. 1K is metallization patterns M12 and M22. Metallization pattern M12 includes conductive traces t12 and t12' formed along the top surface of the dielectric layer 142F, and conductive vias V12 and V12' through the dielectric layer 142F. The conductive vias V12 and V12' of metallization pattern M12 connect conductive traces t12 and t12' of metallization pattern M12 to the metal pattern directly below the dielectric 142F (e.g., the metallization pattern M11), respectively. Metallization pattern M22 includes conductive traces t22 and t22' formed along the top surface of the dielectric layer 142B, and conductive vias V22 and V22' through the dielectric layer 142B. The conductive vias V22 and V22' of metallization pattern M22 connect conductive traces t22 and t22' of metallization pattern M22 to the metal pattern directly below the dielectric 142B (e.g., the metallization pattern M21), respectively.

In some embodiments, the width W12' of the conductive via V12' may be the same as or different from the width W12 of the conductive via V12, and may be different from the width W11' of the conductive via V11'. The width W22' of the conductive via V22' may be the same as or different from the width W22 of the conductive via V22, and may be different from the width W21' of the conductive via V21'. For example, the width W12' is equal to the widths W12, and less than the width W11'; and the width W22' is equal to the widths W22, and less than the width W21'.

In some embodiments, the width W13' of the conductive via V13' may be the same as or different from the width W13 of the conductive via V13, and may be the same as or different from the width W12' of the conductive via V12'. The width W23' of the conductive via V23' may be the same as or different from the width W23 of the conductive via V23, and may be the same as or different from the width W22' of the conductive via V22'. For example, the width W13' is equal to the widths W13 and W12'; and the width W23' is equal to the widths W23 and W22'.

FIG. 1K also illustrates a patterned dielectric layer 162F formed over a top surface of the dielectric layer 142F and the metallization pattern M12, and a patterned dielectric layer 162B formed over a top surface of the dielectric layer 142B and the metallization pattern M22.

Also shown in FIG. 1K is metallization patterns M13 and M23. The metallization pattern M13 includes conductive traces t13 and t13' formed along the top surface of the dielectric layer 162F, and conductive vias V13 and V13' through the dielectric layer 162F. The conductive vias V13 and V13' of metallization pattern M13 connect conductive traces t13 and t13' of metallization pattern M13 to the metal pattern directly below the dielectric 162F (e.g., the metallization pattern M12), respectively. The metallization pattern M23 includes conductive traces t23 and t23' formed along the top surface of the dielectric layer 162B, and conductive vias V23 and V23' through the dielectric layer 162B. The conductive vias V23 and V23' of the metallization pattern M23 connect conductive traces t23 and t23' of metallization pattern M23 to the metal pattern directly below the dielectric 162B (e.g., the metallization pattern M22), respectively.

In some embodiments, one of the conductive vias V13' is directly stacked upon the conductive via V12', and the conductive via V12' is directly stacked on the conductive via V11' to form a stacked via SV1'. Also, the conductive vias V23', V22' and V21' may be combined or not combined to a stacked via SV2'. The conductive vias V13, V12 and V11 may be combined to a stacked via SV1 or not. The conductive vias V23, V22 and V21 may be combined to a stacked via SV2 or not.

The processes and materials used to form the dielectric layers 142F, 142B, 162F and 162B, and the metallization patterns M12, M22, M13 and M23 may be repeated to form the dielectric layers 122F and 122B and the metallization patterns M11 and M12. More or fewer dielectric layers and metallization patterns may be formed in the redistribution structures 180F and 180B. If fewer dielectric layers and metallization patterns are to be formed, steps and process discussed above may be omitted. If more dielectric layers and metallization patterns are to be formed, steps and processes discussed above may be repeated.

Figure 1L:
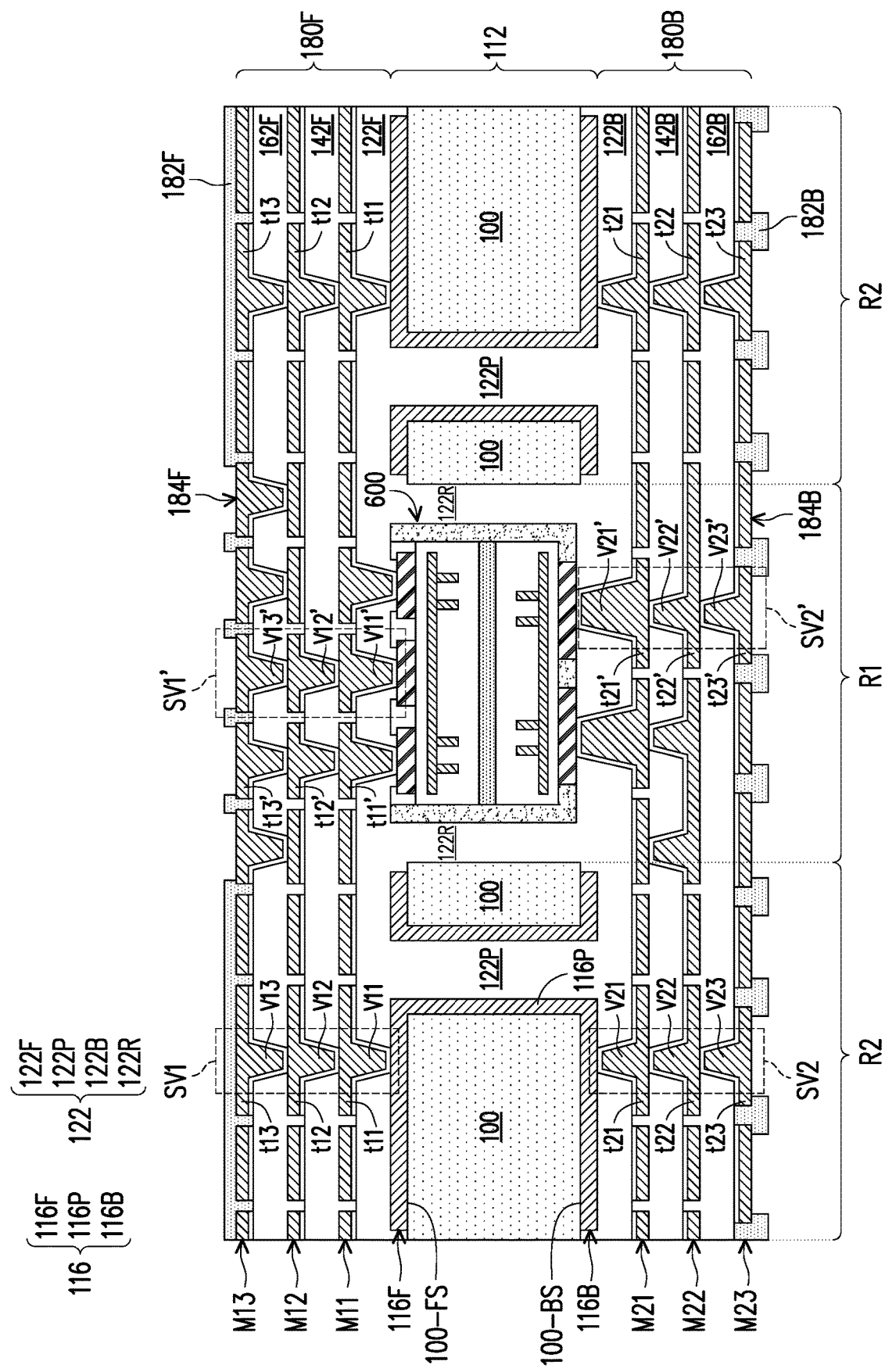

Referring now to FIG. 1L, in some embodiments, a protective layers 182F (e.g., solder resist) is formed over the metallization patterns M13 and the dielectric layer 162F to protect exposed areas of the dielectric layer 162F from external damage. A protective layer 180B (e.g., solder resist) is formed over the metallization patterns M23 and the dielectric layer 162B to protect exposed areas of the dielectric layer 162B from external damage. In some embodiments, the protective layers 182F and 182B each is formed by depositing a layer of photosensitive material, exposing the layer with an optical pattern, and developing the exposed layer to form openings 184F and 184B, respectively. In other embodiments, the protective layers 182F and 182B each may be formed by depositing a non-photosensitive dielectric layer (e.g., silicon oxide, or silicon nitride, or the like), forming a patterned photoresist mask over the dielectric layer using photolithography techniques, and etching the dielectric to form the openings 184F and 184B using a suitable etching process (e.g., dry etching), respectively. Other processes and materials may also be used. The openings 184F expose underlying portions of the conductive traces t13' that may be used as conductive pads P13' to which conductive connectors such as die connectors may be attached. The openings 184B expose underlying portions of the conductive traces t23 and t23' that may be used as conductive pads P23' to which external connectors can be attached.

Figure 1M:
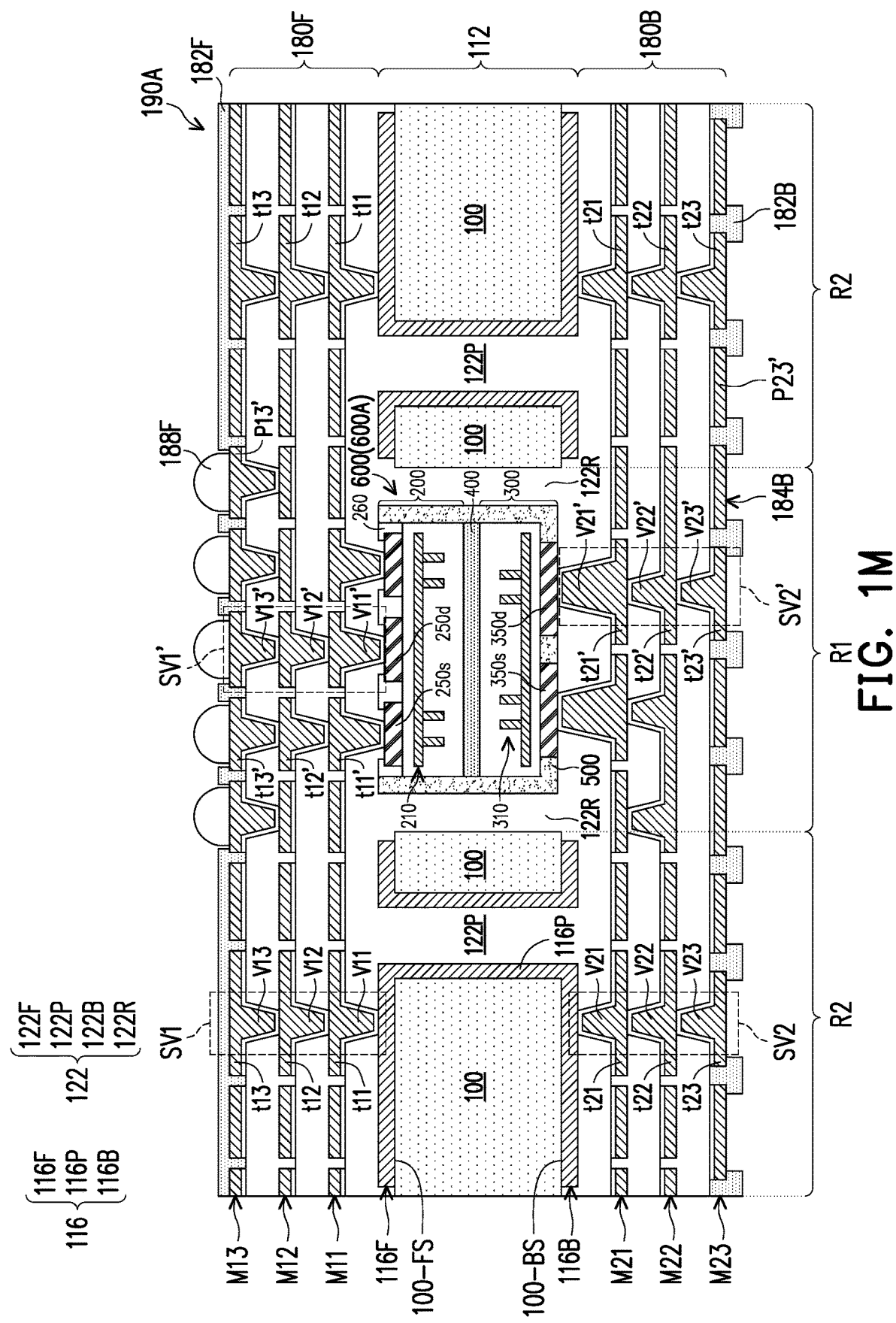

In FIG. 1M, conductive connectors 188F are formed on the conductive pads P13' to form a package substrate 190A in some embodiments. The conductive connectors 188F may be ball grid array (BGA) connectors, solder balls, conductive pillars, controlled collapse chip connection (C4) bumps, micro bumps, electroless nickel-electroless palladium-immersion gold technique (ENEPIG) formed bumps, or the like. The conductive connectors 188F may include a conductive material such as solder, copper, aluminum, gold, nickel, silver, palladium, tin, the like, or a combination thereof. In some embodiments, the conductive connectors 188F are formed by initially forming a layer of solder through such as evaporation, electroplating, printing, solder transfer, ball placement, or the like. Once a layer of solder has been formed on the structure, a reflow may be performed in order to shape the material into the desired bump shapes. In another embodiment, the conductive connectors 188F are conductive pillars (such as a copper pillar) formed by a sputtering, printing, electro plating, electroless plating, CVD, or the like. The conductive pillars may be solder free and have substantially vertical sidewalls. In some embodiments, a metal cap layer (not shown) is formed on the top of the conductive pillars. The metal cap layer may include nickel, tin, tin-lead, gold, silver, palladium, indium, nickel-palladium-gold, nickel-gold, the like, or a combination thereof and may be formed by a plating process.

Figure 1N:
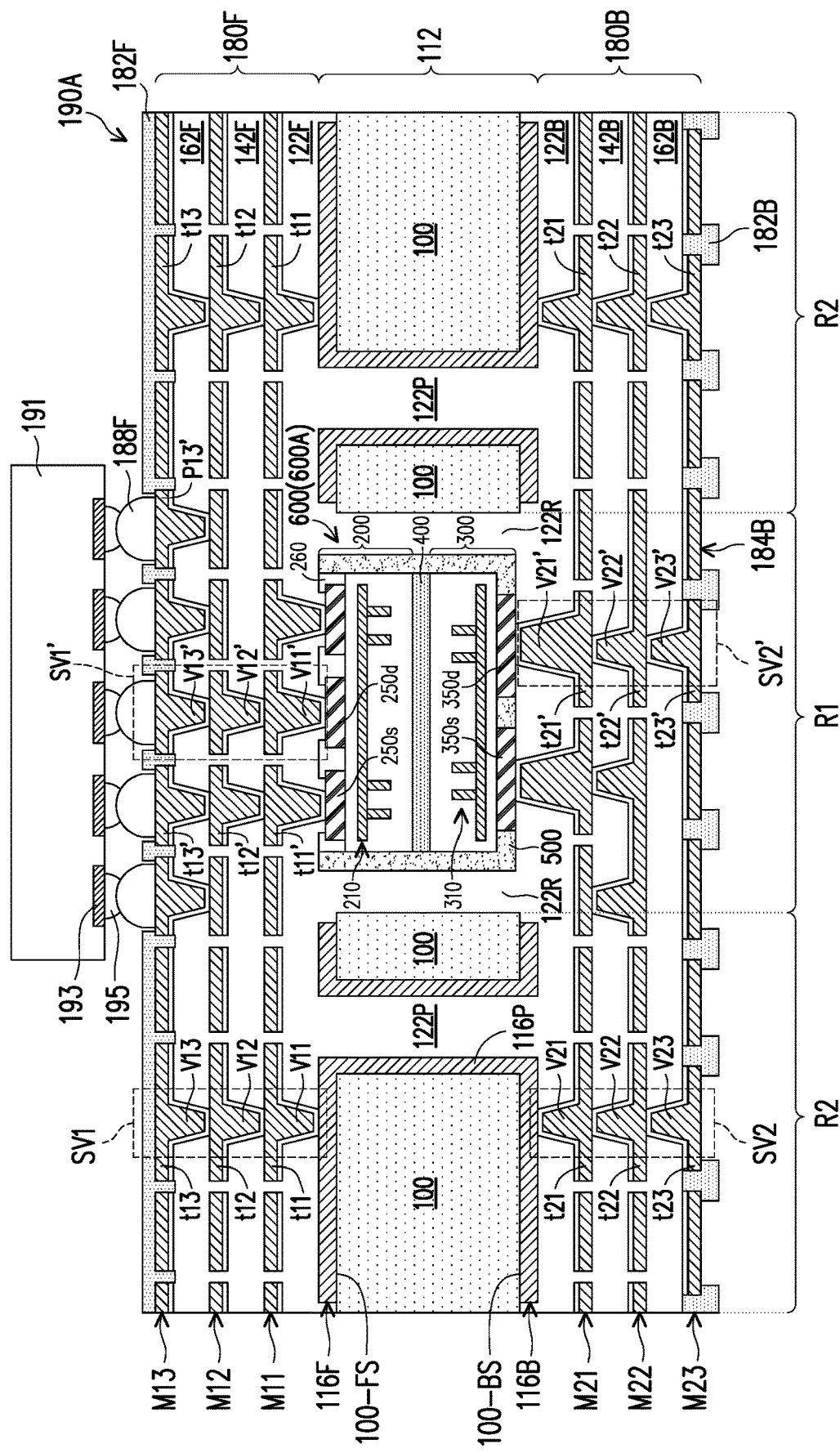
Figure 10:
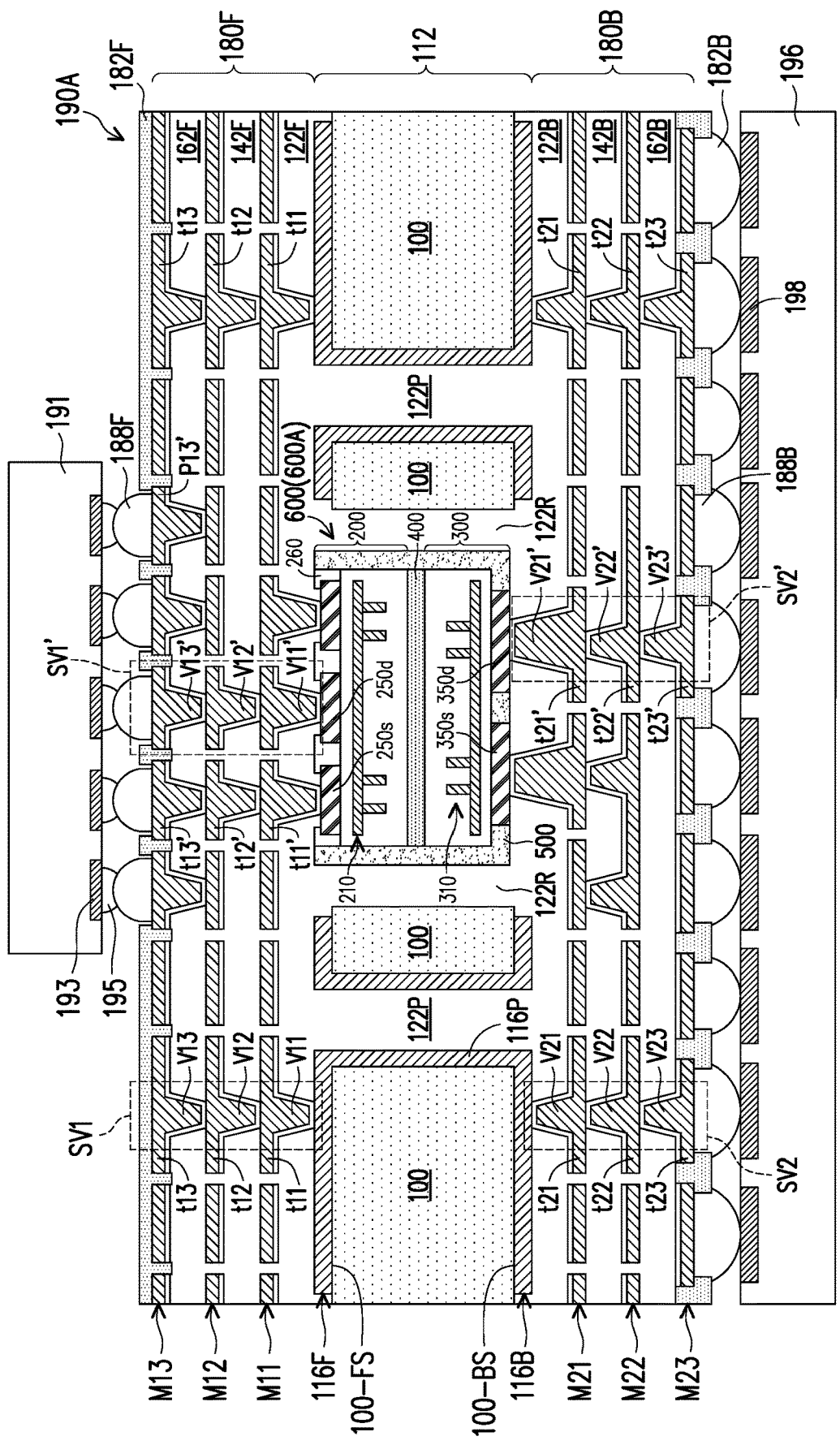

FIG. 1N illustrates the package substrate 190A bonded to a component 191 using the conductive connectors 188F, in accordance with some embodiments. The component 191 may be made of a semiconductor material, such as silicon, germanium, a compound semiconductor, or an alloy semiconductor; doped or undoped; or an active layer of a semiconductor-on-insulator (SOI) substrate. The component 191 may include a die, a package, a packaging substrate, an interposer, PCB, or the like. For example, the component 191 may be a die.

The component 191 may include active and passive device components (not shown). A wide variety of device components such as transistors, capacitors, resistors, combinations of these, and the like may be used to generate the structural and functional requirements of the integrated circuits included in package substrate 190A or any other package connected to package substrate 190A to form a multi-chip module. The device components may be formed using any suitable methods.

The component 191 may also include metallization layers and vias (not shown) and bond pads 193 over the metallization layers and vias. The metallization layers may be formed over the active and passive device components and are designed to connect the various device components to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). The electronic device components and the interconnect system may be formed using any suitable methods.

In some embodiments, the component 191 may be an integrated circuit, such as a memory integrated circuit, a PMIC, a digital logic integrated circuit, an RFIC, and the like. The conductive connectors 188F electrically and/or physically couple the package substrate 190A to the component 191, including metallization layers in the component 191.

In some embodiments, the conductive connectors 188F are reflowed to attach the package substrate 190A to the bond pads 193 of the component 191. In some embodiments, the component 191 has conductive connectors 195 that may be attached to the conductive connectors 188F of package substrate 190A to electrically couple the component 191 to the package substrate 190A. The conductive connectors 188F may have an epoxy flux (not shown) formed thereon before they are reflowed with at least some of the epoxy portion of the epoxy flux remaining after the package substrate 190A is attached to the component 191. This remaining epoxy portion may act as an underfill to reduce stress and protect the joints resulting from the reflowing the conductive connectors 188F. In some embodiments, an underfill (not shown) may be formed between the package substrate 190A and the component 191 and surrounding the conductive connectors 188F. The underfill may be formed by a capillary flow process after the package substrate 190A is attached or may be formed by a suitable deposition method before the package substrate 190A is attached.

Referring to FIG. 1O, in some embodiments, the package substrate 190A is bonded to additional component 196 using conductive connectors 188B formed on conductive pads P23' of the conductive trace t23' located on the side 100-BS and the terminal sides 600-BF. The additional component 196 may be coupled electrically to the package substrate 190A by attaching bond pads 198 of the component 196 to the conductive connectors 188B of the package substrate 190A. in some embodiments, the additional component 196 has conductive connectors (not shown) that may be attached to the conductive connectors 188B of the package substrate 190A to electrically couple the additional component 196.

The capacitor 210 and the capacitor 310 of the semiconductor device 600 may be coupled in parallel or in series through the redistribution structures 180F and 180B, and/or the metallization layers and the vias of the component 191. In some embodiments in which the capacitor 210 and the capacitor 310 are coupled in parallel, the conductive pads 250s and 350s are coupled to a first electrical terminal such as a negative supply voltage ($V_{SS}$), and the conductive pads 250d and 350d are coupled to a second electrical terminal such as a positive supply voltage ($V_{DD}$) through the redistribution structures 180F and 180B, the UBMs 186F, the conductive connectors 188F and the bond pads 193.

The conductive pads 250s and 350s are electrically connected each other in the package substrate 190A through the redistribution structures 180F and 180B, and then coupled to a first electrical terminal such as a negative supply voltage ($V_{SS}$), while the conductive pads 250d and 350d are connected each other package substrate 190A through the redistribution structures 180F and 180B, and then coupled to a second electrical terminal such as a positive supply voltage ($V_{DD}$) in accordance with some embodiments.

The conductive pads 250s and 350s are electrically isolated each other in the package substrate 190A, but connected each other through the metallization layers and the vias of the component 191 so as to couple to a first electrical terminal such as anegative supply voltage ($V_{SS}$), while the conductive pads 250d and 350d are isolated each other in the package substrate 190A, but connected each other through the metallization layers and the vias of the component 191 so as to couple to a second electrical terminal such as a positive supply voltage ($V_{DD}$) in accordance with alternative some embodiments.

The semiconductor device 600 may be configured by various device components. In alternative some embodiments, the semiconductor device 600 may be the semiconductor device 600B shown in FIG. 5A. The more detailed structure of the device semiconductor device 600B is shown in FIG. 5B.

Figure 5B:
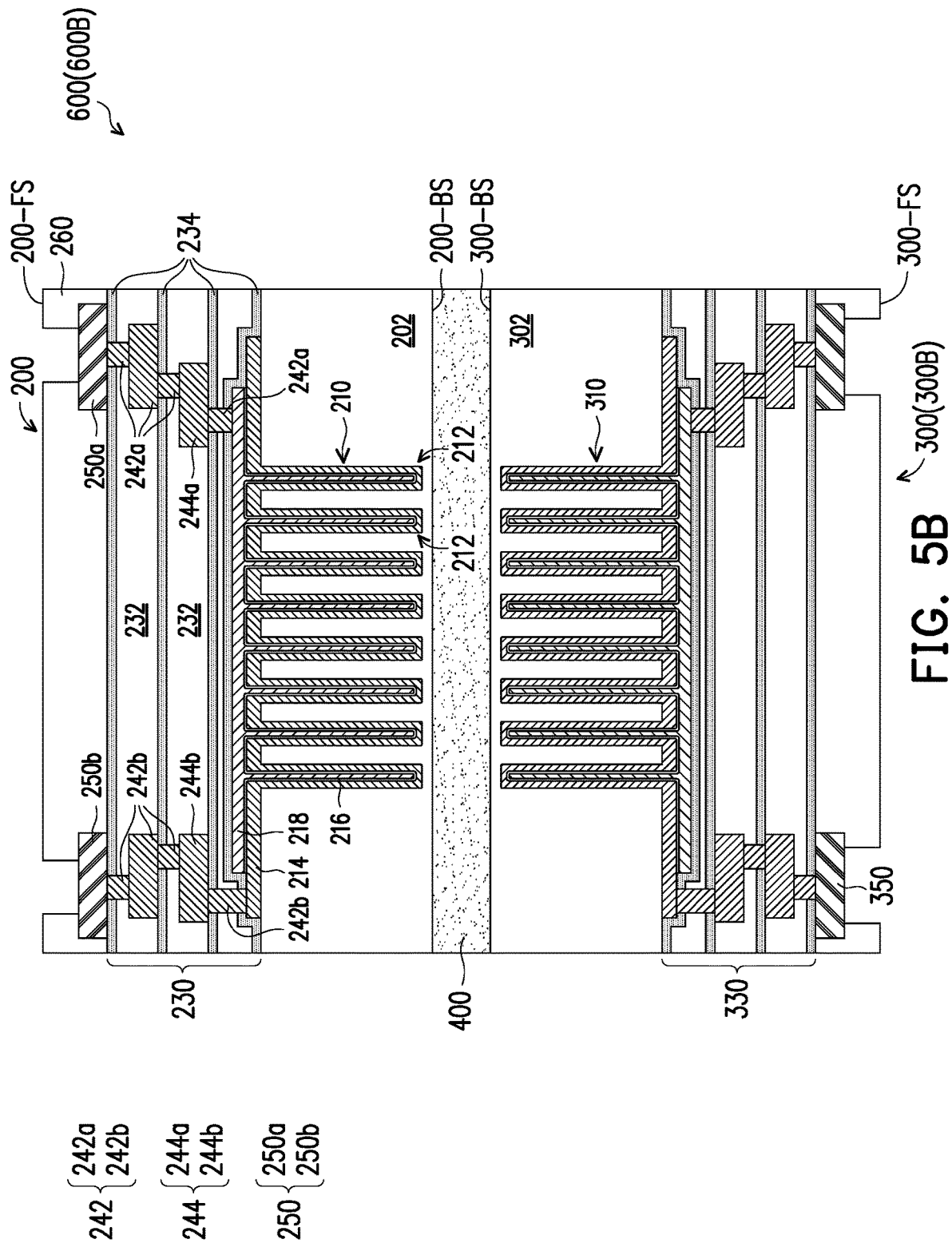

Referring to FIGS. 5A and 5B, the semiconductor device 600B may include device components 200 and 300B. The device component 200 is bonded to the device component 300B through an adhesive 400 in back-to-back manner. The semiconductor device 600B is free of the encapsulation layer 500 shown in FIG. 2D, and thus the sidewalls of the device components 200 and 300B, and the adhesive 400 are exposed.

In FIGS. 5A and 5B, the device component 200 may be a passive component, and may be similar to the device component 200 shown in FIG. 4A. The device component 300A may be a passive component, and may be similar to the device component 200 shown in FIG. 4A. In some embodiments, the device component 300B includes a semiconductor substrate 302, a capacitor 310, an interconnect structure 330, conductive pads 350, and a passivation layer 360. The semiconductor substrate 302, the capacitor 310, the interconnect structure 330, the conductive pads 350, and the sub-passivation layer 360 of the device component 300B may be similar to corresponding components of the device component 200. The passivation layer 360 is formed on a dielectric layer of the interconnect structure 330 and on portions of the conductive pads 350. The passivation layer 360 may be or comprise, for example, silicon oxide, silicon nitride, polyimide, some other suitable dielectric(s), or any combination of the foregoing. In some embodiments, the top area A3 of the conductive pads 350 each is greater than the top area A2 of the conductive pad 250 as shown in FIG. 4B, but it is not limited thereto.

Figure 5C:
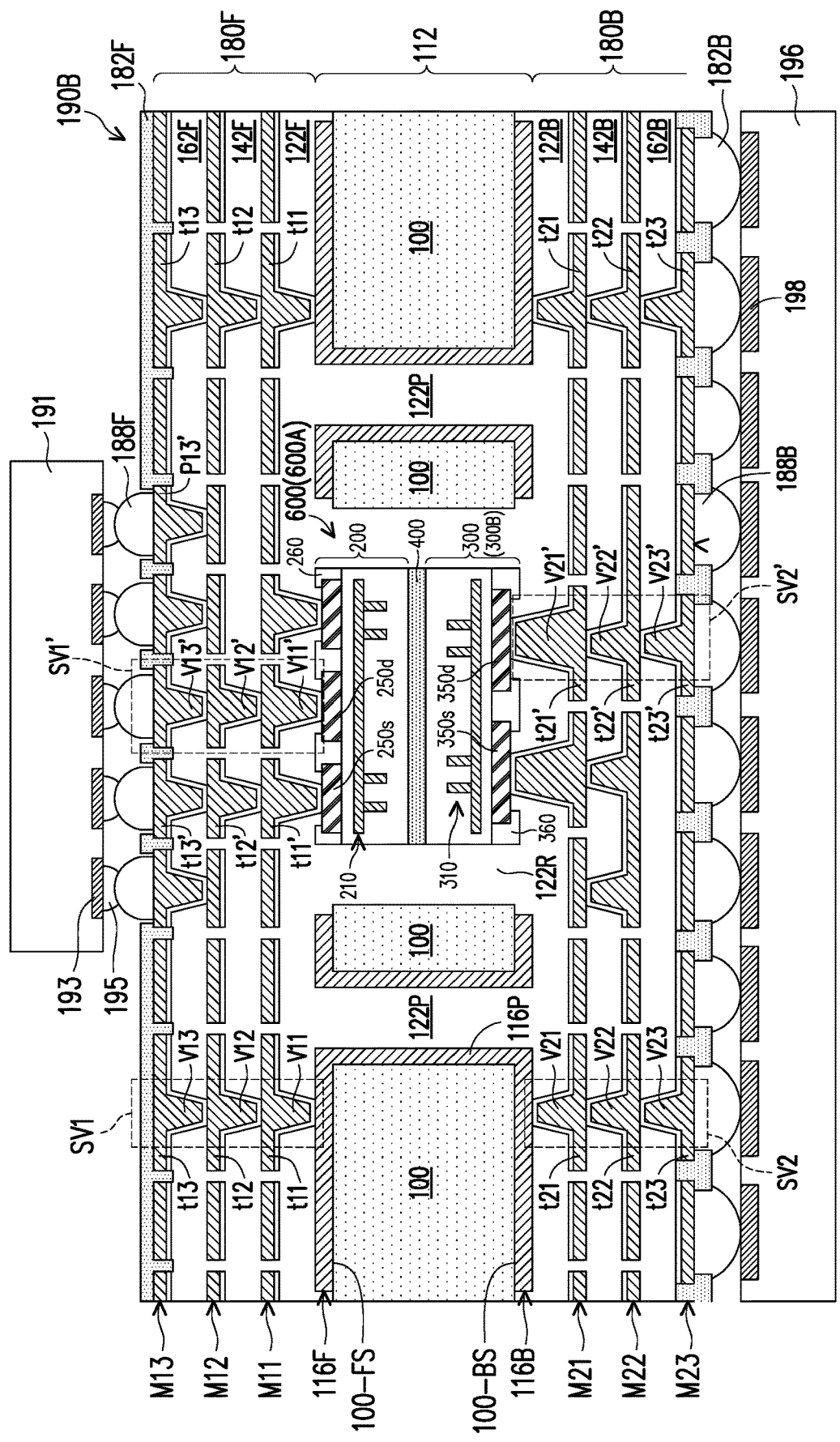
FIG. 5C illustrate cross-sectional views of intermediate steps of a package using a package substrate having a semiconductor device embedded therein, in accordance with other some embodiments.

Referring to FIG. 5C, there is shown a package substrate 190B boned to a component 191 using conductive connectors 188F, and boned to a component 196 using conductive connectors 188b in accordance with some embodiments. The package substrate 190B is similar to the package substrate 190A, but the semiconductor device 600A is replaced by the semiconductor device 600B.

In FIG. 5C, the semiconductor device 600B is encapsulated by the dielectric layer 122R, and the sidewalls of the device components 200 and 300B, and the adhesive 400 of the semiconductor device 600B are in physically contact with the dielectric layer 122R.

The semiconductor device 600 may be varied based on the specifications of the design. The semiconductor device 600 may configured by two tiers or more tiers (not shown). In some embodiments, the semiconductor device 600 is configured by two tiers including one upper device component (such as the device component 200 shown in FIGS. 3D and 5A) and one lower device component (such as the device component 300 shown in FIGS. 3D and 5A) in accordance with some embodiments. The semiconductor device 600 may be a semiconductor device 600C which is configured by two or more upper device components (such as the device component $200_1$ and $200_2$) and one lower device component (such as the device component $300_1$), as shown in FIG. 6A. The semiconductor device 600 may be a semiconductor device 600D which is configured by two or more upper device components (such as the device component $200_1$ and $200_2$) and two or more lower device components (such as the device component $300_1$ and $300_2$) in accordance with alternative some embodiments, as shown in FIG. 6B. The device components $200_1$, $200_2$, $300_1$ and $300_2$ may have a same size or different sizes, and a same shape or different shapes. The device components $200_1$ and $200_2$ may be separated by an encapsulation layer $500_1$, and the components $300_1$ and $300_2$ may be separated by another encapsulation layer $500_2$. The device components $200_1$, $200_2$, $300_1$ and $300_2$, and the adhesive 400 may be encapsulated by an encapsulation layer 500 or not. The device components $200_1$, $200_2$, $300_1$ and $300_2$ each may be a passive component or an active component. The device components $200_1$, $200_2$, $300_1$ and $300_2$ are passive components having a same type or different types. The device components $200_1$ and $200_2$ may be similar to or different from the device component 200, while the components $300_1$ and $300_2$ may be similar to or different from the device component 300.

Embodiments such as those discussed herein provide greater integration capabilities by allowing the semiconductor device having double side electrical terminals embedded in a package substrate to couple to a component attached on the package substrate through redistribution structures of the package substrate. Embodiments such as those discussed herein also provide a better via/dielectric design for preventing the reliability issue.

In accordance with some embodiment, a package substrate is provided. The package substrate comprises a substrate having a cavity hole therein, and a semiconductor device in the cavity hole. The semiconductor device has first terminal side and a second terminal side opposite to the first terminal side. The package substrate further includes a first redistribution structure on the first terminal side of the cavity substrate to electrically couple to a first pad and a second pad on the first terminal side of the semiconductor device; and a second redistribution structure on the second side of the cavity substrate to electrically couple to a third pad and fourth pad on the second terminal side of the semiconductor device.

In accordance with another embodiment, a package is provided. The package comprises a component bonded to and electrically coupled to a package substrate, wherein the package substrate comprises: a cavity substrate comprising a cavity hole therein; a semiconductor device in the cavity hole, wherein the semiconductor device has a first device component and a second device component bonded through a back-to-back bonding, the first device component comprising a first capacitor and the second device component comprising a second capacitor; a first redistribution structure on a first side of the cavity substrate to electrically couple to a first electrode and a second electrode of the first capacitor; and a second redistribution structure on the second side of the cavity substrate to electrically couple to a third electrode and a fourth electrode of the second capacitor. The first pad and the third pad are coupled to a first terminal, and the second pad and fourth pad are couple to a second terminal through the first redistribution structure and the second redistribution structure.

In accordance with yet another embodiments, a method of manufacturing a semiconductor device is provided. The method comprising: providing a semiconductor device; placing the semiconductor device in a cavity hole of a cavity substrate, wherein the semiconductor device has first terminal side and a second terminal side opposite to the first terminal side; forming a dielectric layer along sidewalls, the first terminal side and the second terminal side of the semiconductor device, and the cavity hole, a first side and a second side opposite to the first side of the cavity substrate; forming a first redistribution structure on the first side of the cavity substrate to electrically couple to the first terminal side of the semiconductor device; and forming a second redistribution structure on the second side of the cavity substrate to electrically couple to the second terminal side of the semiconductor device.

The foregoing outlines features of several embodiments so that those skilled in the art may better understand the aspects of the present disclosure. Those skilled in the art should appreciate thon they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and thon they may make various changes, substitutions, and alterations herein without departing from the spirit and scope of the present disclosure.

What is claimed is:

1. A package substrate comprising:
a substrate, the substrate comprising a cavity hole therein;
a semiconductor device embedded in the cavity hole, wherein the semiconductor device has first terminal side and a second terminal side opposite to the first terminal side;
a first redistribution structure on a first side of the cavity substrate to electrically couple to a first pad and a second pad on the first terminal side of the semiconductor device; and
a second redistribution structure on a second side of the cavity substrate to electrically couple to a third pad and fourth pad on the second terminal side of the semiconductor device, wherein the semiconductor device comprises:
a first device component having the first pad, the second pad, and a first trench capacitor; and
a second device component having the third pad, the fourth pad, and a second trench capacitor, wherein a backside of the first device component is bonded to a backside of the second device component,
wherein the first pad of the first device component is connected to a first electrode of the first trench capacitor and a first terminal, and the second pad of the first device component is connected to a second electrode of the first trench capacitor and a second terminal; and
the third pad of the second device is connected to a third electrode of the second trench capacitor and the first terminal, and the fourth pad of the second device is connected to a fourth electrode of the second trench capacitor and the second terminal.

2. The package substrate of claim 1, wherein the semiconductor device comprises:
an adhesive inserted between and bonded the backside of the first device component and the backside of the second device component.

3. The package substrate of claim 2, wherein the first device component further comprises a passivation layer on portions of the first pad and the second pad.

4. The package substrate of claim 3, wherein the semiconductor device further comprises:
an encapsulation layer laterally encapsulating the first device component, the second device component and the adhesive, wherein the encapsulation layer is in contact with sidewalls of the passivation layer, and sidewalls of the third pad and the fourth pad of the second device component.

5. The package substrate of claim 2, wherein the first pad has an area less than an area of the third pad, and the second pad has an area less than an area of the fourth pad;
the first redistribution structure comprises a first via connected to the first pad, and a second via connected to the second pad; and
the second redistribution structure comprises a third via connected to the third pad, and a fourth via connected to the fourth pad,
wherein the first via and the second pad has widths less than widths of the third via and the fourth via.

6. The package substrate of claim 5, wherein the first via and the second via have heights less than heights of the third via and the fourth via.

7. The package substrate of claim 5, wherein the first via has a width greater than a width of a fifth via of the first redistribution structure outside an area of the first device component.

8. The package substrate of claim 5, wherein
the substrate has through holes therein,
the substrate further comprises conductive traces extending from a first side to a second side of the substrate, through sidewalls of the through holes, and
the dielectric layer further fills into the through holes.

9. The package substrate of claim 2, wherein:
the first device component further comprises a first passivation layer on portions of the first pad and the second pad;
the second device component further comprises a second passivation layer on portions of the third pad and the fourth pad; and
the package substrate further comprises a dielectric layer filled in the cavity hole, wherein the dielectric layer is in contact with sidewalls of the first device component, the second device component and the adhesive of the semiconductor device.

10. A package comprising:
a component bonded to and electrically coupled to a package substrate, wherein the package substrate comprises:
a cavity substrate comprising a cavity hole therein;
a semiconductor device embedded in the cavity hole, wherein the semiconductor device has a first device component and a second device component bonded through a back-to-back bonding, the first device component comprising a first pad, a second pad, and a first capacitor, and the second device component comprising a third pad, a fourth pad, and a second capacitor;
a first redistribution structure on a first side of the cavity substrate to electrically couple to a first electrode and a second electrode of the first capacitor; and
a second redistribution structure on the second side of the cavity substrate to electrically couple to a third electrode and a fourth electrode of the second capacitor,
wherein the first pad and the third pad are coupled to a first terminal, and the second pad and fourth pad are couple to a second terminal through the first redistribution structure and the second redistribution structure.

11. The package of claim 10, wherein the first capacitor and the second capacitor comprise trench metal-insulator-metal (MIM) capacitors.

12. The package of claim 10, wherein the first redistribution structure comprises:
a first via inside an area of the semiconductor device; and
a second via outside the area of the semiconductor device, wherein a size of the first via is greater than a size of the second via.

13. The package of claim 10, wherein the first redistribution structure comprises:
a first stacked via connected to the first pad of the first device component; and
a second stacked via connected to the second pad of the first device component.

14. The package of claim 10, wherein the first device component further comprises a passivation layer on portions of the first pad and the second pad.

15. The package of claim 14, wherein the semiconductor device further comprising:
an encapsulation layer laterally encapsulating the first device component, the second device component and the adhesive, wherein the encapsulation layer is in contact with sidewalls of the passivation layer, and sidewalls of the third pad and the fourth pad of the second device component.

16. A method of forming a semiconductor structure, the method comprising:
providing a semiconductor device;
placing the semiconductor device in a cavity hole of a cavity substrate, wherein the semiconductor device has first terminal side and a second terminal side opposite to the first terminal side;
forming a dielectric layer along sidewalls, the first terminal side and the second terminal side of the semiconductor device, and the cavity hole, a first side and a second side opposite to the first side of the cavity substrate;
forming a first redistribution structure on the first side of the cavity substrate to electrically couple to the first terminal side of the semiconductor device; and
forming a second redistribution structure on the second side of the cavity substrate to electrically couple to the second terminal side of the semiconductor device,
wherein the providing the semiconductor device comprises:
providing a first device component having the first terminal side and a first trench capacitor; and
providing a second device component having the second terminal side and a first trench capacitor,
the first device component has first pad and second pad, the first pad is connected to a first electrode of the first trench capacitor and a first terminal, and the second pad is connected to a second electrode of the first trench capacitor and a second terminal; and
the second device component has third pad and fourth pad, the third pad is connected to a third electrode of the second trench capacitor and the first terminal, and the fourth pad is connected to a fourth electrode of the second trench capacitor and the second terminal.

17. The method of claim 16, further comprising forming the cavity substrate, wherein forming the cavity substrate comprises:
forming through holes in a substrate;
forming a conductive layer on sidewalls of the through holes, and a first side and a second side of the substrate;
patterning the conductive layer to form conductive traces; and
after forming the conductive traces, forming the cavity hole in the substrate.

18. The method of claim 16, wherein the providing the semiconductor device comprises:
bonding a backside of the first device component to a backside of the second device component through an adhesive.

19. The method of claim 18, further comprising:
laterally encapsulating the first device component, the second device component and the adhesive with an encapsulation layer.

20. The method of claim 18, wherein the forming the dielectric layer further fills into the cavity hole of the cavity substrate and is in contact with sidewalls of the first device component, the second device component and the adhesive.

* * * * *